(12) United States Patent
Toshikiyo et al.

(10) Patent No.: US 7,663,084 B2
(45) Date of Patent: *Feb. 16, 2010

(54) SOLID-STATE IMAGER AND SOLID-STATE IMAGING APPARATUS HAVING A MODULATED EFFECTIVE REFRACTIVE INDEX DISTRIBUTION AND MANUFACTURING METHOD THEREOF

(75) Inventors: Kimiaki Toshikiyo, Osaka (JP); Takanori Yogo, Kyoto (JP); Motonori Ishii, Osaka (JP); Toshinobu Matsuno, Kyoto (JP); Kazutoshi Onozawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/189,971

(22) Filed: Aug. 12, 2008

(65) Prior Publication Data
US 2009/0020840 A1   Jan. 22, 2009

Related U.S. Application Data

(63) Continuation of application No. 11/423,776, filed on Jun. 13, 2006.

(30) Foreign Application Priority Data

Jun. 17, 2005   (JP) .............................. 2005-178585

(51) Int. Cl.
*H01L 27/00* (2006.01)
(52) U.S. Cl. .................... 250/208.1; 250/216; 257/432; 359/566; 359/569; 359/742
(58) Field of Classification Search ................. 250/216, 250/208.1, 208.2, 214.1, 214 R; 257/414, 257/184–189, 225–234, 431–466; 359/742, 359/569, 566, 565; 438/57–98
See application file for complete search history.

(56) References Cited

U.S. PATENT DOCUMENTS 4,994,664 A    2/1991   Veldkamp (Continued)

FOREIGN PATENT DOCUMENTS

CN         1116719         2/1996

(Continued)

OTHER PUBLICATIONS

D. W. Prather, "Design and application of subwavelength diffractive lenses for integration with infrared photodetectors," Opt. Eng. 38(5), pp. 870-878 (May 1999; Society of Photo-Optical Instrumentation Engineers).

(Continued)

*Primary Examiner*—Thanh X Luu
*Assistant Examiner*—Francis M Legasse, Jr.
(74) *Attorney, Agent, or Firm*—Greenblum & Bernstein P.L.C.

(57) ABSTRACT

A solid-state imaging apparatus includes a plurality of unit pixels with associated microlenses arranged in a two-dimensional array. Each microlens includes a distributed index lens with a modulated effective refractive index distribution obtained by including a combination of a plurality of patterns having a concentric structure, the plurality of patterns being divided into line widths equal to or shorter than a wavelength of an incident light. At least one of the plurality of patterns includes a lower light-transmitting film having the concentric structure and a first line width and a first film thickness, and an upper light-transmitting film having the concentric structure configured on the lower light-transmitting film having a second line width and a second film thickness. The distributed index lens has a structure in which a refractive index material is dense at a center and becomes sparse gradually toward an outer side in the concentric structure.

15 Claims, 25 Drawing Sheets

U.S. PATENT DOCUMENTS

| | | | |
|---|---|---|---|
| 5,227,915 A * | 7/1993 | Grossinger et al. | 359/565 |
| 5,561,558 A | 10/1996 | Shiono et al. | |
| 5,742,433 A * | 4/1998 | Shiono et al. | 359/575 |
| 5,815,327 A | 9/1998 | Wong | |
| 6,166,854 A | 12/2000 | Katsuma | |
| 6,524,772 B1 | 2/2003 | Huang et al. | |
| 6,927,915 B2 | 8/2005 | Nakai | |
| 2003/0044729 A1* | 3/2003 | Huang et al. | 430/321 |
| 2003/0168679 A1 | 9/2003 | Nakai et al. | |
| 2004/0042081 A1* | 3/2004 | Te Kolste et al. | 359/569 |
| 2004/0125048 A1* | 7/2004 | Fukuda et al. | 345/30 |
| 2005/0057815 A1* | 3/2005 | Lai et al. | 359/652 |
| 2005/0152036 A1* | 7/2005 | Shiono et al. | 359/569 |
| 2005/0195485 A1* | 9/2005 | Hirai et al. | 359/569 |
| 2006/0102827 A1 | 5/2006 | Kasuga et al. | |
| 2006/0278948 A1 | 12/2006 | Yamaguchi et al. | |
| 2006/0285228 A1 | 12/2006 | Ishii et al. | |
| 2007/0035721 A1 | 2/2007 | Toshikiyo et al. | |
| 2007/0146531 A1 | 6/2007 | Toshikiyo | |
| 2007/0164329 A1 | 7/2007 | Toshikiyo | |

FOREIGN PATENT DOCUMENTS

| | | |
|---|---|---|
| CN | 1404158 | 3/2003 |
| JP | 4-343471 | 11/1992 |
| JP | 11-186530 | 7/1999 |
| JP | 11-194207 | 7/1999 |
| JP | 2000-039503 | 2/2000 |
| JP | 2001-108812 | 4/2001 |
| JP | 2001-318217 | 11/2001 |
| JP | 2002-135796 | 5/2002 |
| JP | 2003-229553 | 8/2003 |
| JP | 2004-20957 | 1/2004 |

OTHER PUBLICATIONS

English language Abstract of JP 2004-20957.
English language Abstract and partial translation of JP 2001-108812.
English language Abstract and partial translation of JP 2001-318217.
English language Abstract of JP 2003-229553.
English language Abstract and partial translation of JP 2002-135796.
English language Abstract and partial translation of JP 4-343471.
English language Abstract of CN 1404158, Mar. 19, 2003.
English language Abstract of CN 1116719, Feb. 14, 1996.
English language Abstract and partial English language translation (Paragraph Nos. [0083] — [0087] and Fig. 9 ) of JP2000-039503, Feb. 8, 2000.
English language Abstract of JP 11-194207, Jul. 21, 1999.
English language Abstract and partial English language translation (Paragraph No. [0023] and Fig. 3 ) of JP 11- 186530, Jul. 9, 1999.

* cited by examiner

Phase modulation

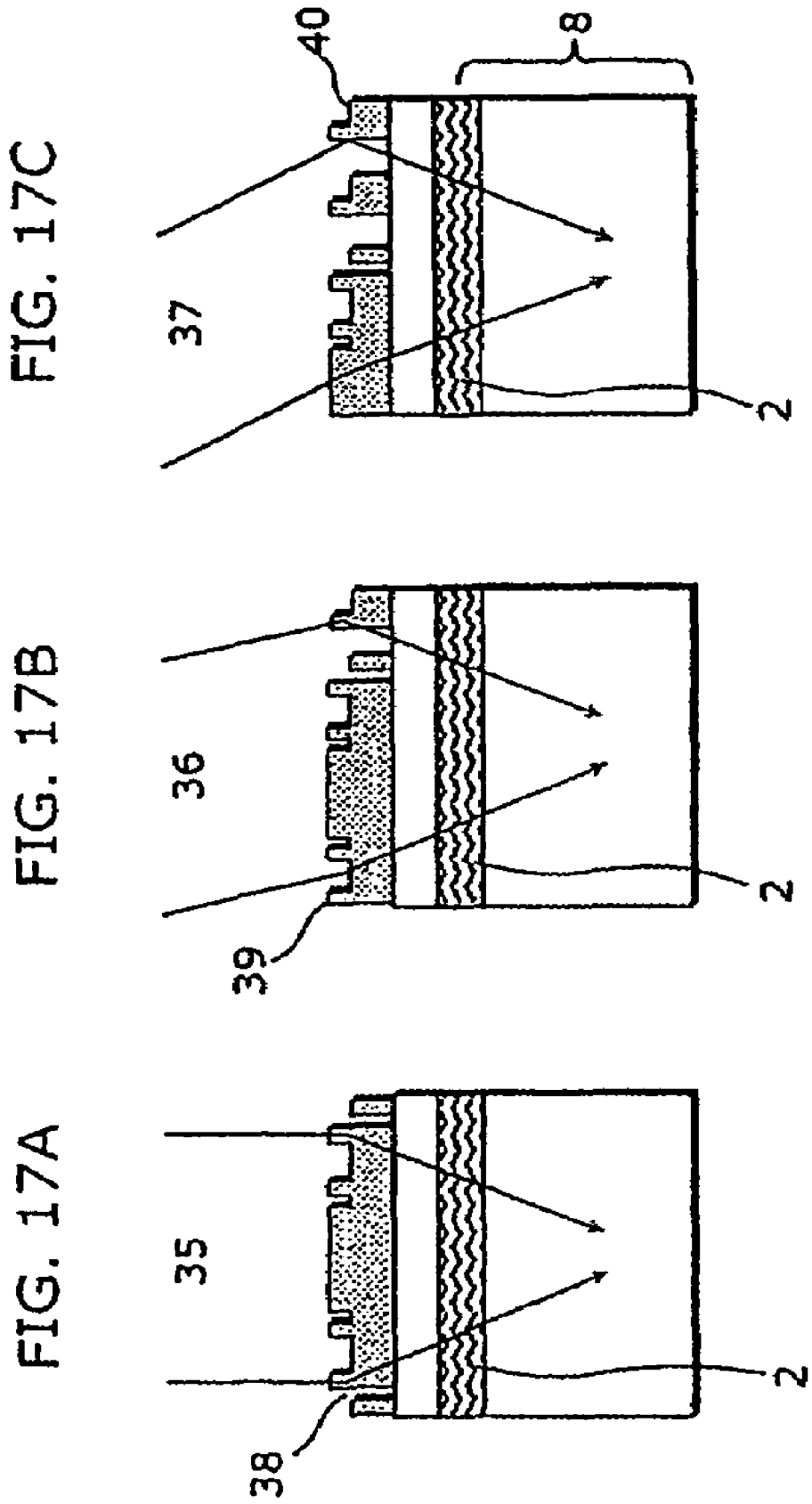

US 7,663,084 B2

SOLID-STATE IMAGER AND SOLID-STATE IMAGING APPARATUS HAVING A MODULATED EFFECTIVE REFRACTIVE INDEX DISTRIBUTION AND MANUFACTURING METHOD THEREOF

CROSS-REFERENCE TO RELATED APPLICATION

This application is a continuation of pending U.S. patent application Ser. No. 11/423,776, filed Jun. 13, 2006, the disclosure of which is expressly incorporated herein by reference in its entirety.

This application claims priority of Japanese Patent Application No. 2005/178585, filed Jun. 17, 2005, the disclosure of the which is expressly incorporated by reference herein.

BACKGROUND OF THE INVENTION (1) Field of the Invention

The present invention relates to a solid-state imaging apparatus used for a digital camera and the like, and a manufacturing method thereof.

(2) Description of the Related Art

Along with the widespread use of an imaging device-related products (a digital camera, a camera-equipped mobile phone and the like), the market of the solid-state imaging apparatus has been remarkably developed. In the current of such development, the needs have changed to a wide angle in addition to a high sensitivity and a high pixel density (hereafter, called as "high pixel") of the solid-state imaging apparatus due to a tendency to a thin camera module with a tendency to a thin digital still camera, a thin mobile phone and the like. A downsizing of a camera optical system indicates that a lens used for the camera module becomes to have a short focal length. More particularly, a light is incident on a solid-state imaging apparatus with a wide angle (in other words, a wide angle measured from a vertical axis of an incidence plane of a solid-state imaging device composing a solid-state imaging apparatus).

In the present, in a charged-coupled device (CCD) and a metal oxide semiconductor (MOS) Imaging device that are commonly used as solid-state imaging apparatuses, a solid-state imaging device (called as "pixel") which are semiconductor integrated circuits having a light-receiving unit are arranged in a two-dimensional array, in which a light signal from an object is converted into an electric signal.

The sensitivity of the solid-state imaging apparatus is defined based on an amount of output current of a light-collecting device to an amount of incident light, so that leading the incident light surely into the light-collecting device is an important factor for improving the sensitivity.

FIG. 5 is a diagram showing an example of a basic structure of a conventional solid-state imaging device. As shown in FIG. 5, a light 58 (light indicated by dashed lines) which is incident vertically into a microlens 60 is separated into colors using one of red (R), green (G), and blue (B) color filters 2, and then converted into an electric signal at a light-receiving device 6. Since relatively high light-collecting efficiency can be obtained conventionally, the microlens is used in almost all solid-state imaging devices.

In the future development of a solid-state imaging device supporting a wide angle incidence, it is necessary to lead an incident light at a specific angle surely into the light-collecting device.

However, in the conventional microlens, the light-collecting efficiency decreases depending on the incident angle of a signal light. More particularly, in FIG. 5 the light 58 which is incident vertically into the microlens 60 can be collected with high efficiency, while a light 59 (light indicated by solid lines) which is incident obliquely into the microlens 60 is collected with relatively lower efficiency. This is because that the light 59 which is incident obliquely is intercepted at an Al interconnection 3 in a solid-state imaging device, so that the light 59 does not reach the light-receiving device 6.

As described above, the solid-state imaging apparatus is made up of multiple pixels that are arranged in a two-dimensional array. Therefore, in the case of incident light with a spread angle, the angle of incidence differs between the pixels in the central area and the pixels near the edge (refer to FIG. 2). As the result, there is a problem that the light-collecting efficiency of the pixels near the edge decreases than that of the pixels in the central area.

FIG. 3 is an example of a cross-sectional diagram showing pixels near the edge. The incident angle of the incident light is relatively greater at pixels near the edge. Therefore, the improvement of the light-collecting efficiency is sought by displacing electric wiring parts to the inner direction which means by shrinking.

FIG. 4 is a diagram showing a dependency on an incident angle of the light-collecting efficiency of the solid-state imaging device using a microlens. It shows that the light-collecting efficiency of the solid-state imaging device using a microlens is relatively high for the incident light of the incident angle of around 20°. However, the light-collecting efficiency declines suddenly for the incident light of the incident angle of more than 20°. As the result, the amount of light collected at pixels near the edge is about 40 percent of that at the pixels in the central area, and the sensitivity of the whole pixels is limited by the sensitivity of the pixels near the edge at present. This value further declines with the decrease of the pixel size so that its application to an optical system with a short focal length such as a small-sized camera becomes very difficult. Furthermore, in a manufacturing method thereof, there is a problem that further circuit shrinking is not possible.

In view of aforesaid problem, it is necessary to design a microlens which is able to support the incident angle in order to prevent a decrease of the sensitivity of the solid-state imaging device associated with the increase of incident angle. However, although the current pixel size of the solid-state imaging device is as extremely fine as 2.2 μm, finer size of pixel is needed in order to realize further high pixel density in the future. Thus, processing of microlens is executed on a sub-micron basis, so that forming the microlens by the currently used thermal reflow processing is not possible.

As described above, in order to realize the solid-state imaging device applicable to an optical system (an optical system with a high incident angle θ) with a short focal length for a thin camera, a new type of light-collecting device, which can be formed by easy fine processing and also the light-collecting device whose light-collecting efficiency is not lowered even when an incident angle is high, comparing with microlens, needs to be developed.

In recent years, along with development of a planar process technology represented by optical lithography and electron beam lithography, a light-collecting device (Subwavelength Lens: SWLL) having a periodic structure of a sub-wavelength draws an attention. Here, a sub-wavelength area indicates an area with the same size as the wavelength of a light concerned or an area smaller than that. A certain research group of a university has substantiated that an aspherical Fresnel lens is changed to an SWLL having grid pattern, so that a light-collecting effect can be expected (for example Non-patent reference 1). As a method, the conventional Fresnel lens (FIG.

1 (a)) is divided by an area 61 of λ/2n (λ: wavelength of incident light, n: refractive index of lens material), so as to obtain a linear approximation (FIG. 1 (b)) and a rectangular approximation (FIG. 1 (c)) in each area, and thus the SWLL is formed. In addition, in the same way, it has been reported that a line width in a structure in a sub-wavelength area can be controlled, so that a blazed binary optical diffraction device can be formed, and thus diffraction efficiency is improved (for example Patent Reference 1).

If the SWLL could be used as the light-collecting device for the solid-state imaging device, the microlens could be formed using a general semiconductor process, and also the shape of microlens could be controlled without limitation.

However, the divided period of the SWLL (for example the area 61 in FIG. 1) is strongly dependent on a wavelength of incident light. Therefore, the divided period becomes 0.1 to 0.3 μm in an optical wavelength area. By the aforesaid method, the blazed binary optical diffraction device needs to be formed by further microstructure (0.01 to 0.1 μm), and forming such microstructure is extremely difficult by the currently available process.

Non-patent Reference 1: Opt. Eng. 38 870-878, D. W. Prather, 1998

Patent Reference 1: Japanese Laid-Open Patent 2004-20957

SUMMARY OF THE INVENTION

In view of the aforesaid problem, an object of the present invention is to provide a solid-state imaging apparatus and the like which is able to support an optical system whose incident angle is wide.

In the present invention, a distributed index lens which provides the same effect has been invented by a discretization of the refractive index distribution in an area with about a half of width of the wavelength of the incident light in size. The structure of the lens of the present invention is on a boundary theoretically between an area of a resonance in diffractive optics and an area of effective refractive method. At this time, the incident light is affected by both the refractive index of the material itself and the refractive index which is averaged based on the structure. As a result, the distributed index lens includes light-collecting characteristics of both a distributed index lens and a film thickness distribution lens, so that the collecting efficiency is higher than the conventional distributed index lens.

In addition, the line width of the basic structure stays constant by a sub-micron basis, so that the process conditions such as lithography and etching can be identical between pixels. As a result, the process can be performed with ease and high accuracy.

In view of the aforesaid problem, a solid-state imaging device according to the present invention, a light-collecting device includes a combination of a plurality of zone areas with a concentric structure, the plurality of zone areas being divided into line width which are equal to or shorter than a wavelength of an incident light, at least one of the plurality of zone areas includes: a lower light-transmitting film with the concentric structure and having a first line width and a first film thickness; and an upper light-transmitting film with the concentric structure, configured above the lower light-transmitting film, and having a second line width and a second film thickness. According to this configuration, the manufacture of the light-collecting device (the distributed index lens) following the conventional semiconductor planer process can be realized, so that the solid-state imaging device with high accuracy can be provided.

In addition, in a part of a vertical cross-section including a center of the light-collecting device, a light-transmitting film, which is formed by combining the upper light-transmitting film and the lower light-transmitting film, may form a convex portion, a light-transmitting film, which is formed by combining the upper light-transmitting film and the lower light-transmitting film, may form a concave, a light-transmitting film, which is formed by combining the upper light-transmitting film and the lower light-transmitting film, may form a step-like portion, and a light-transmitting film, which is formed by combining the upper light-transmitting film and the lower light-transmitting film, may form a rectangle portion.

In addition, in the light-collecting device, a light incoming side has a sparse structure, and an effective refractive index on the light incoming side is lower than an effective refractive index on a light outgoing side. According to this configuration, a convex lens can be formed, so that the lens with high light-collecting efficiency can be formed.

In addition, in the light-collecting device, a light outgoing side has a sparse structure, and an effective refractive index on the light outgoing side is lower than an effective refractive index on a light incoming side. According to this configuration, the process for manufacture of the distributed index lens can be simplified, so that the cost required for the manufacture can be reduced.

In addition, in the light-collecting device, the respective line widths are defined as approximately $\lambda/2$ μl, where $\lambda$ denotes a wavelength of an incident light and n denotes a refractive index. According to this, the lens includes light collecting characteristics of both a distributed index lens and a film thickness distribution lens, so that the light-collecting efficiency is higher than the conventional distributed index lens.

In addition, in the light-collecting device, each line width is an equal line width. According to this, the line width of the basic structure stays constant, so that the process for manufacture of the distributed index lens can be performed with ease and high accuracy.

In addition, the second film thickness is greater than the first film thickness. According to this, the reproducibility of the refractive index (low n area) can be improved. In other words, the amount of change in a high refractive index area becomes greater and the amount of change in a low refractive index area becomes smaller with the change of the structure, so that the refractive index (low n area) can be controlled more easily.

In addition, the second film thickness is smaller than the first film thickness. According to this, the reproducibility of the refractive index (high n area) can be improved. In other words, the amount of change in a high refractive index area becomes smaller and the amount of change in a low refractive index area becomes greater with the change of the structure, so that the refractive index (high n area) can be controlled more easily.

In addition, light-collecting device is formed by at least two kinds of light-transmitting materials with different refractive indexes. According to this, the strength of the lens is increased and the contamination is decreased, so that the reliability of the lens can be raised.

In addition, the light-collecting device is formed by the plurality of light-transmitting materials whose refractive index difference is not more than 0.5. According to this, the light-collecting efficiency at the time of low incident angle (0 to 20°) can be raised.

In addition, the light-collecting device is formed by the plurality of light-transmitting materials whose refractive index difference is 0.5 and more. According to this, the light-collecting efficiency at the time of high incident angle (20 to 40°) can be raised.

In addition, the light-collecting device includes one of $TiO_2$, $ZrO_2$, $Nb_2O_5$, $Ta_2O_5$, $Si_3N_4$ and $Si_2N_3$. These are the materials having high refractive index and enable to make the film thickness of the light-collecting device thin, so that the manufacture process can be simplified.

In addition, the light-collecting device includes one of $SiO_2$ doped with B or P, that is Boro-Phospho Silicated Glass, and Teraethoxy Silane. These are the materials generally used in the conventional semiconductor process and enable to form the light-collecting device with ease, so that the manufacture cost can be reduced.

In addition, the light-collecting device includes one of benzocyclobutene, polymethymethacrylate, polyamide and polyimide. The resign can be processed by a tool directly, so that a mass production can be raised.

In addition, in the light-collecting device, a structure of a light-transmitting film in a vertical cross-section including a center of the light-collecting device, which is formed by combining the upper light-transmitting film and the lower light-transmitting film, is different depending on a wavelength of an incident light. According to this, the lens structure of each pixel can be optimized based on the wavelength of the incident light, so that, the difference of the light-collecting efficiency between colors can be eliminated.

In addition, in the light-collecting device, the structure of the light-transmitting film is different depending on focal length setting for a collected light. According to this, the focus distance of the incident light is variable, so that the lens design suitable for each pixel structure is possible.

In addition, in the light-collecting device, the structure of the light-transmitting film is different depending on an incident angle of the incident light. According to this, the light-collecting device corresponding to the incident angle of the incident light can be formed, so that the solid-state imaging device which is strong to a wide angle incidence can be realized.

In addition, the light-collecting device includes a light-transmitting film, which is formed by combining the upper light-transmitting film and the lower light-transmitting film, as an in-layer lens. According to this, the strength of the lens can be increased.

In addition, a light-transmitting film, which is formed by combining the upper light-transmitting film and the lower light-transmitting film, forms a taper structure in the cross-section structure. According to this, a change of the refractive index on the cross-section is continuous, and the reflection component on the surface becomes smaller, so that the light-collecting efficiency can be improved.

In addition, in one of the zone areas, a position of the upper light-transmitting film and a position of the lower light-transmitting film are shifted by a predetermined misalignment margin. According to this, regarding the upper light-transmitting film and the lower light-transmitting film configuring the light-collecting device, the positioning of each film is done considering a misalignment generated when these films are positioned, so that an adverse effect caused by a misalignment between the position of the upper light-transmitting film and the position of the lower light-transmitting film can be reduced, as a result the process can be simplified.

In addition, the solid-state imaging apparatus including unit pixels that are arranged in a two-dimensional array, each unit pixel including a light-collecting device, the light-collecting device includes a combination of a plurality of zone areas with a concentric structure, the plurality of zone areas being divided into line width which are equal to or shorter than a wavelength of an incident light, and at least one of the plurality of zone areas includes: a lower light-transmitting film with the concentric structure and having a first line width and a first film thickness; and an upper light-transmitting film with the concentric structure, configured above the lower light-transmitting, and having a second line width and a second film thickness. According to this, the solid-state imaging apparatus including a light-collecting device with high light-collecting efficiency can be provided.

In addition, a center of the concentric structure of the light-collecting device is shifted from a center of the unit pixel. According to this, the sensitivity of the solid-state imaging device can be improved.

In addition, the light-collecting device is formed on a whole area of the corresponded unit pixel. According to this, the aperture ratio becomes higher, so that the sensitivity of the solid-state imaging device can be improved.

In addition, a total thickness of the first film thickness and the second film thickness in the light-collecting device in the unit pixel which locates in a center of the apparatus is greater than a total thickness of the first film thickness and the second film thickness in the light-collecting device in the unit pixel which locates near an edge of the apparatus. According to this, color shadings between pixels and the difference of the amount of the incident light can be reduced.

In addition, the solid-state imaging apparatus includes a light-receiving device, in the unit pixels located in the center of the apparatus, a central axis of each of the light-receiving devices is placed to match a central axis of each of the light-collecting devices, and in the unit pixels located near the edge of the apparatus, a central axis of each of the light-receiving devices and a central axis of each of the light-collecting devices are placed toward the center of the solid-state imaging apparatus. According to this, the lens structure can be simplified and also a high light-collecting efficiency can be expected, so that the sensitivity of the solid-state imaging device can be improved.

In addition, a method for manufacturing a solid-state imaging apparatus according to the present invention which includes unit pixels that are arranged in a two-dimensional array, each unit pixel including a light-collecting device which has a light-transmitting film with a predetermined film thickness and a light-receiving device, the method including: forming a semiconductor device integrated circuit, in which the light-receiving device, an interconnection, a light-shielding layer, and a signal transmission unit are mounted on an Si substrate; depositing a light-transmitting film on the semiconductor integrated circuit; processing the light-transmitting film so as to form a concentric structure; forming a film made of Bottom Anti-reflection Coating and a resist on the processed light-transmitting film; and forming a lower light-transmitting film with the concentric structure with a first film thickness and an upper light-transmitting film with the concentric structure with a second film thickness. According to this, the conventional semiconductor process can be used, so that the cost required for the manufacture can be reduced.

The solid-state imaging device having aforesaid lens structure enables to improve a resolution and the sensitivity, and moreover the manufacturing process can be simplified.

Further Information about Technical Background to this Application

The disclosure of Japanese Patent Application No. 2005-178585 filed on Jun. 17, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 17 A to FIG. 17 C are diagrams showing a basic structure of one pixel which is dependent on an incident angle of the second embodiment;

DESCRIPTION OF THE PREFERRED EMBODIMENTS

Hereafter, embodiments of the present invention will be described referring to diagrams. It should be noted that the present invention will be explained using the embodiments below and the attached diagrams just as examples, and it is obvious that the present invention is not limited to these examples.

First Embodiment

Figure 1:
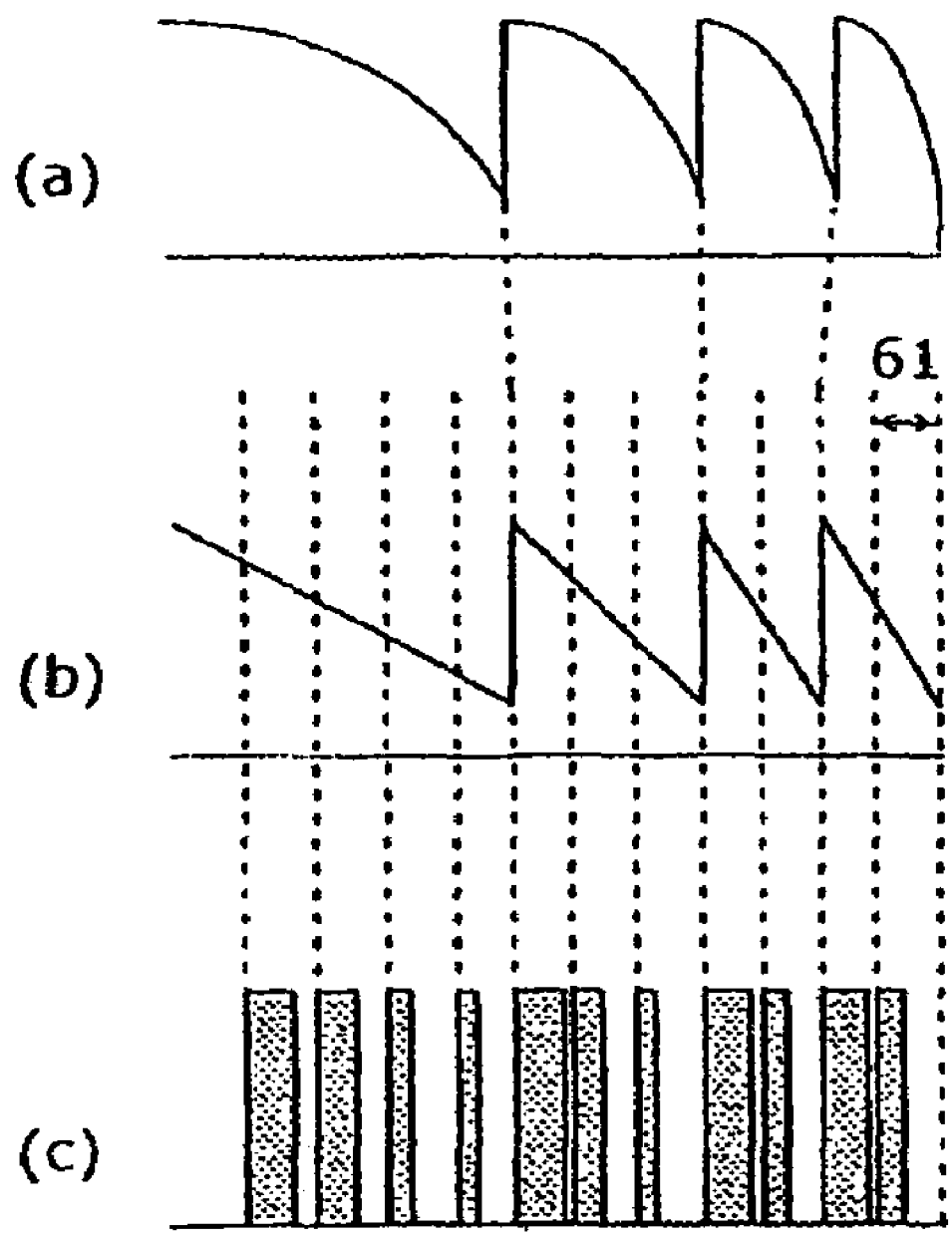
FIG. 1 is a cross section diagram showing a structure of conventional sub-wavelength lens.
Figure 2:
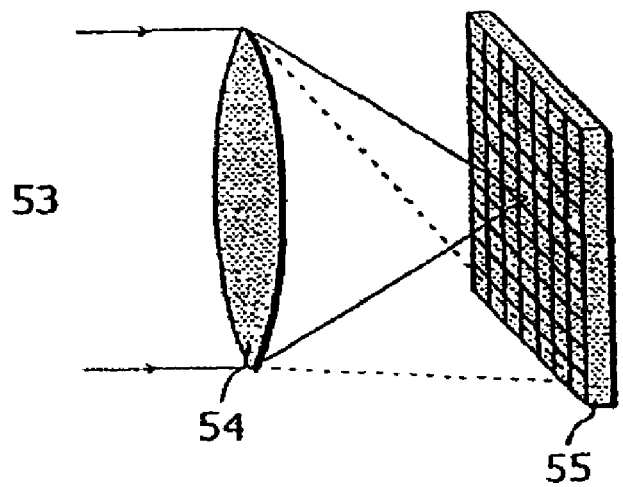
FIG. 2 is a diagram showing a basic structure of a conventional pixel array.
Figure 3:
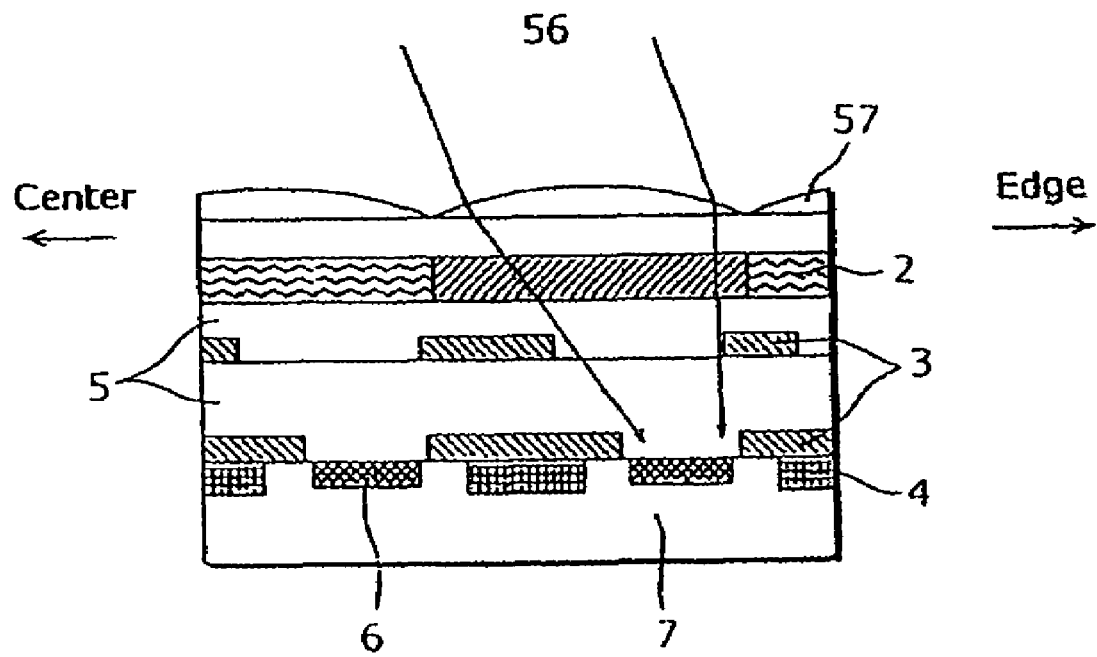
FIG. 3 is a diagram showing a basic structure of a conventional solid-state image device.
Figure 4:
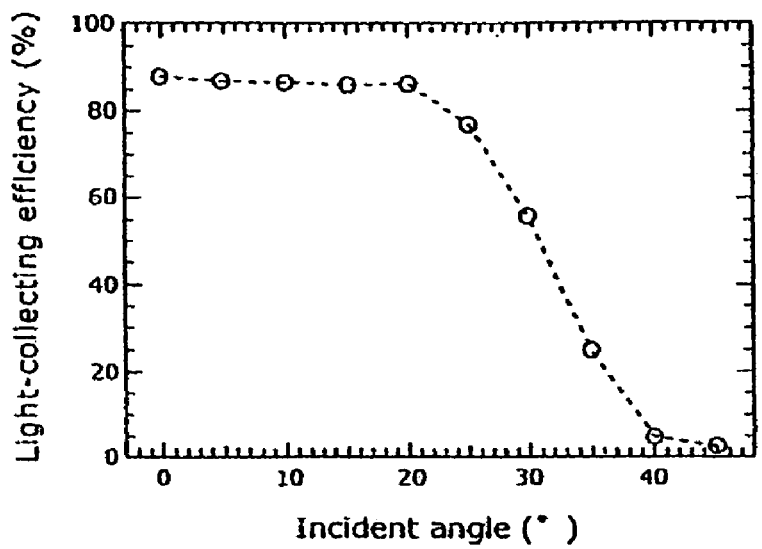
FIG. 4 is a diagram showing the light-collecting efficiency of the solid-state image device using a conventional microlens.
Figure 5:
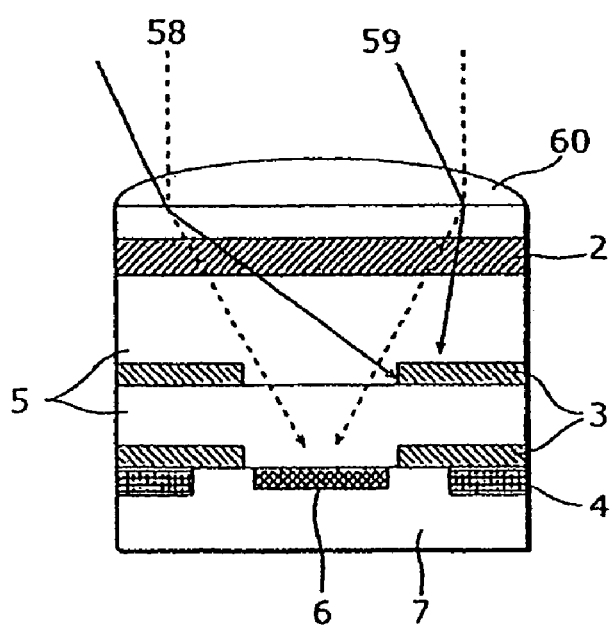
FIG. 5 is a diagram showing an example of a basic structure of a conventional solid-state imaging device.
Figure 6:
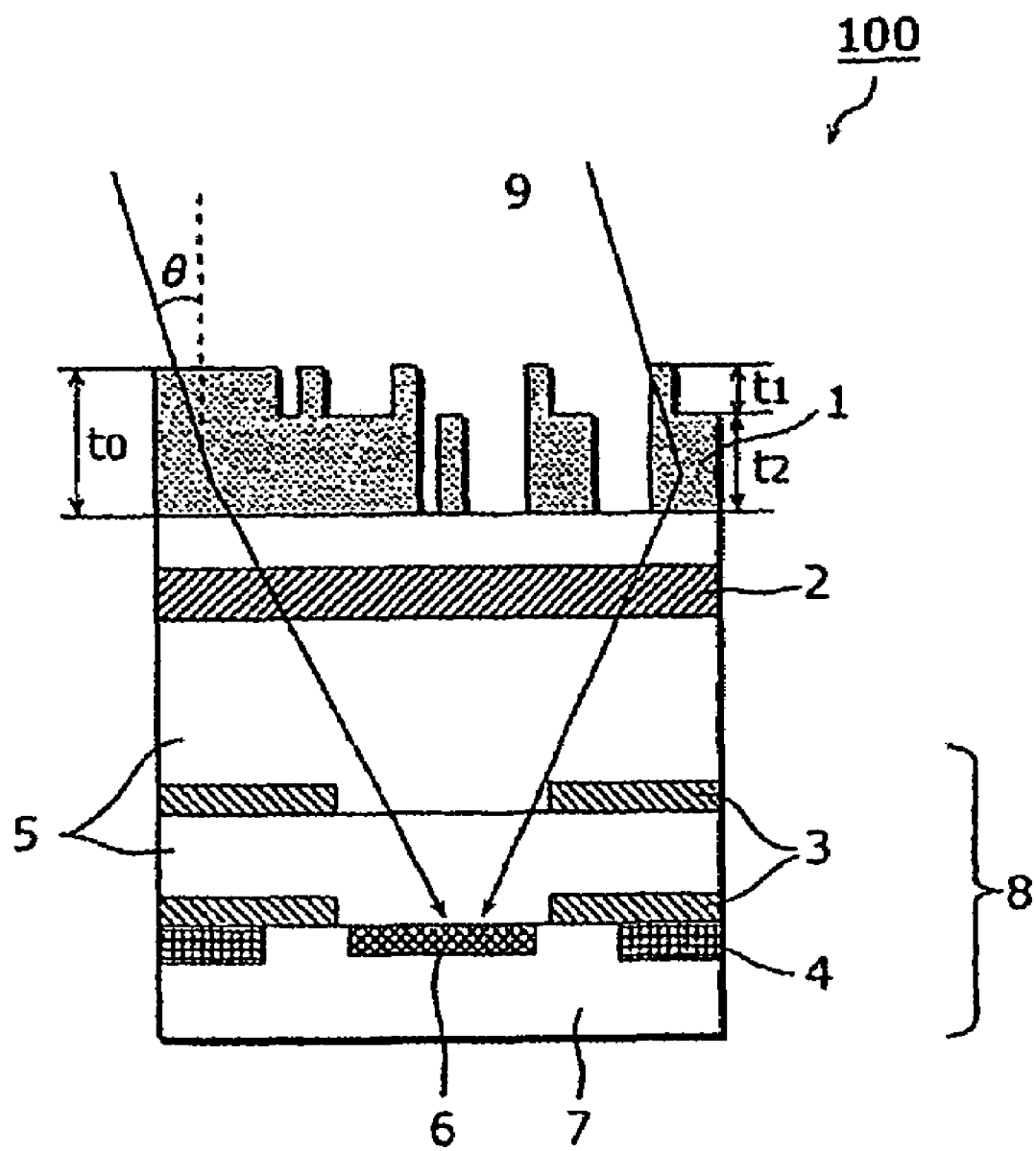
FIG. 6 is a diagram showing a basic structure of a solid-state imaging device of the first embodiment.

FIG. 6 is a diagram showing a basic structure of a solid-state imaging device according to the present embodiment. As shown in FIG. 6, the solid-state imaging device (also called as pixel) 100 is 2.25 μm square in size, and includes a distributed index lens 1, a color filter 2, an Al interconnections 3, a signal transmitting unit 4, a planarized layer 5, a light-receiving device (Si photodiodes) 6, and an Si substrate 7 (note that as shown in FIG. 6, from the Al interconnections 3 to the Si substrate 7 is also called as a semiconductor integrated circuit 8).

Figure 7:
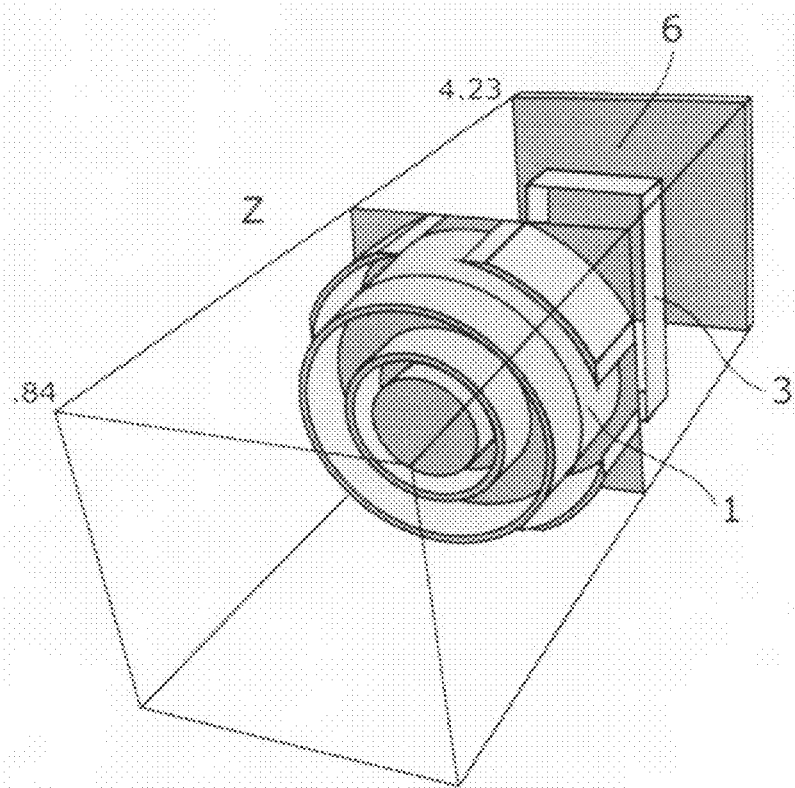
FIG. 7 is a diagram showing a three-dimensional structure of one pixel of the first embodiment.

FIG. 7 is a diagram showing a three-dimensional structure of the solid-state imaging device 100 shown in FIG. 6. FIG. 7 shows just simply the distributed index lens 1 (for 0°), the Al interconnections 3 and the light-receiving device 6. FIG. 7 also shows that the distributed index lens 1 having a two-stage concentric structure (more specifically, a two-stage concentric circle structure) is equipped as a component in the solid-state imaging device 100.

Figure 8:
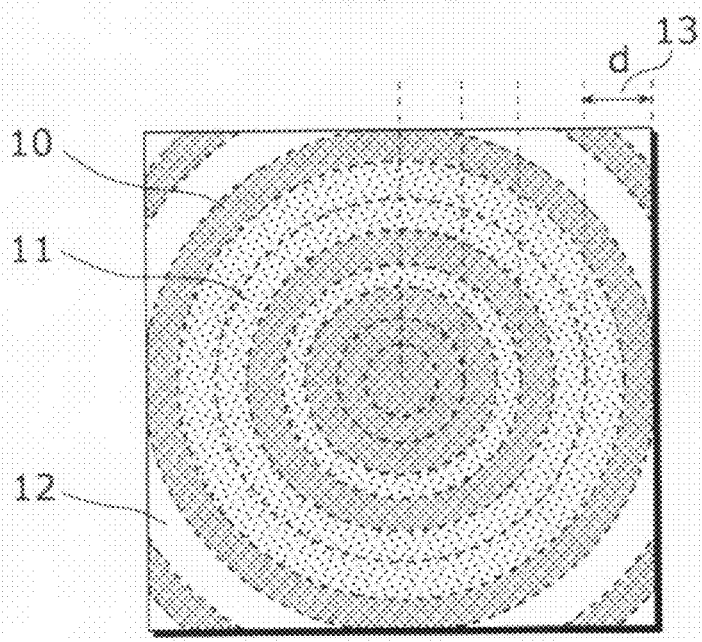
FIG. 8 is a top view diagram of a distributed index lens of the first embodiment.

FIG. 8 is a top view diagram of the distributed index lens 1 shown in FIG. 6. The concentric circle structure of the distributed index lens 1, which is composed of $SiO_2$ (n=2), is formed by two-stage concentric circle structure with the film thicknesses 0.4 μm ($t_1$) and 0.8 μm ($t_2$) as shown in FIG. 6. It should be noted that the concentric circle structure of an upper/a lower is defined as an upper light-transmitting film/a lower light transmitting film in the description. In FIG. 8, the parts of the film thickness 1.2 μm are shown with "fine dots" and the parts of film thickness 0.8 μm are shown with "coarse dots". Note that the parts with the film thickness of 0 μm are shown "without pattern: white color". The structure of the distributed index lens 1 of the present embodiment is formed by engraving $SiO_2$ so as to make a concentric circle structure, and the medium surrounding the distributed index lens 1 is air (n=1).

Here, the shape of the area where the distributed index lens 1 being formed is rectangular in accordance with the aperture of each pixel. In general, in the case where the shape of the incident window area is circle, gaps between lenses are generated. Therefore, light is leaked from the gaps, so that a light-collecting loss is increased. However, when the shape of the incident window is rectangular, it is possible to collect incident light with the whole area of the pixel. Therefore, light does not leak, so that the light-collecting loss can be reduced.

Figure 9:
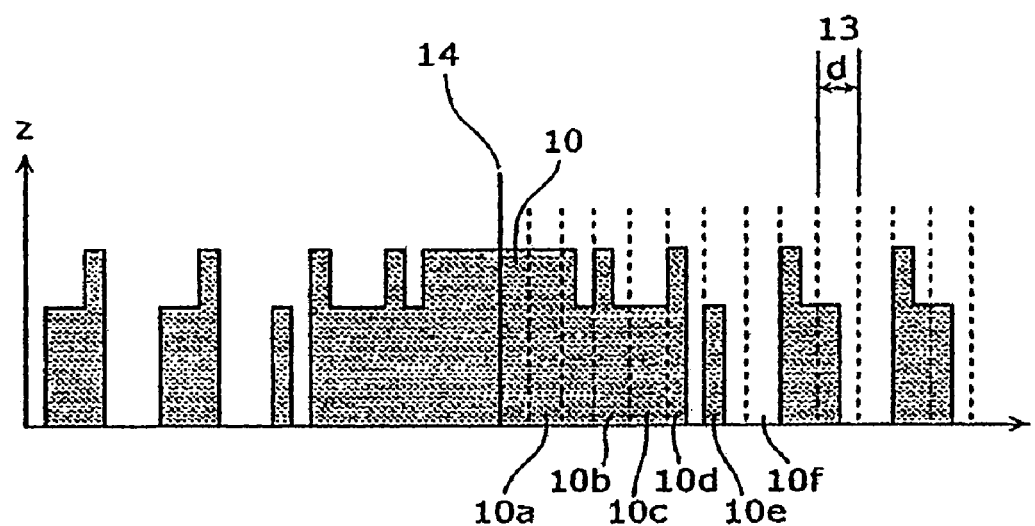
FIG. 9 is a cross-sectional diagram of the distributed index lens of the first embodiment.

FIG. 9 is an example of a detailed cross-sectional diagram of the distributed index lens 1 of the present embodiment. The refractive index of such general distributed index lens shows its highest index at the optical center. As shown in FIG. 9, in the case of the present embodiment, SiO$_2$ is densely collected around the optical center 14, and becomes sparse towards the outer zone area. Here, in a case where the width of each zone area (hereafter called as "line width d") 13 is almost same as or less than a width of a wavelength of an incident light, an effective refractive index which a light senses is defined according to a volume ratio (the volume ratio is equal to "a thickness ratio" in the case of the concentric circle structure) between a high refractive index material (for example, SiO$_2$) and a low refractive index material (for example, air). More specifically, when the high refractive index material is increased in the zone area, the effective refractive index is raised, while when the high refractive index material is decreased in the zone area, the effective refractive index is lowered.

Figure 10:
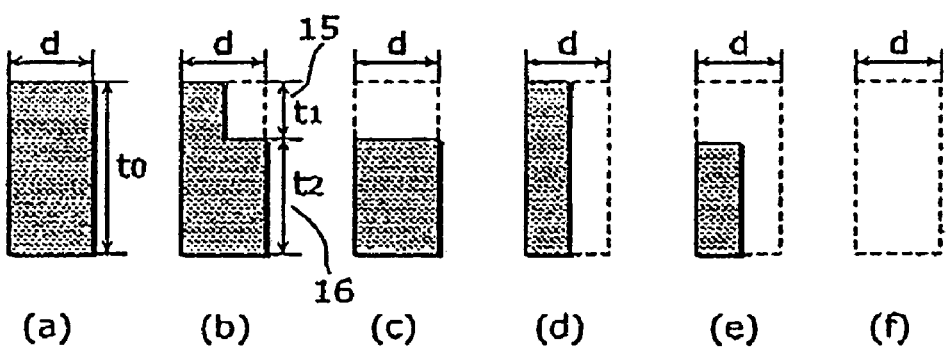
FIG. 10 is a diagram showing basic patterns of a film thickness between a high refractive index material and a low refractive index material in each zone area having two-stage concentric circle structure of the first embodiment.

FIG. 10 is a diagram showing basic patterns of the film thickness between the high refractive index material and the low refractive index material in each zone area having two-stage concentric circle structure. FIG. 10 (a) shows a structure of the most densely collected structure, and more specifically the effective refractive index of this structure is the highest, and the effective refractive index becomes lower towards FIG. 10 (f). At this time, the upper film thickness t$_1$ 15 at light incident side is 0.4 μm and the lower film thickness T$_2$ 16 at substrate side is 0.8 μm, and the film thickness ratio (upper/lower) is 0.5. Here, in the case where the aforesaid thickness ratio is changed, the effective refractive index can be controlled. For example, when the thickness ratio is increased, the decrease of the volume of the high refractive index material is relatively big due to the change of the basic structures (from FIG. 10 (a) towards FIG. 10 (f)). Thus, the decrease of the refractive index in the area with high effective refractive index becomes greater. On the contrary, when the thickness ratio is lowered, the decrease of the volume of the high refractive index material is relatively small. Thus, the decrease of the refractive index in the area with low effective refractive index becomes big.

In the present embodiment, the basic structures such as FIG. 10 (a) to FIG. 10 (f) are used as an example for easier description. However, other structures can be used. For example, a convex structure by combining FIG. 10 (b) and FIG. 10 (c) can be used, and also a concave structure by combining FIG. 10 (b) and FIG. 10 (d) can be used. At this time, in the case where such structures are used in the area with about half-width of the wavelength of the incident light, the same light-collecting characteristic can be obtained.

Figure 11:
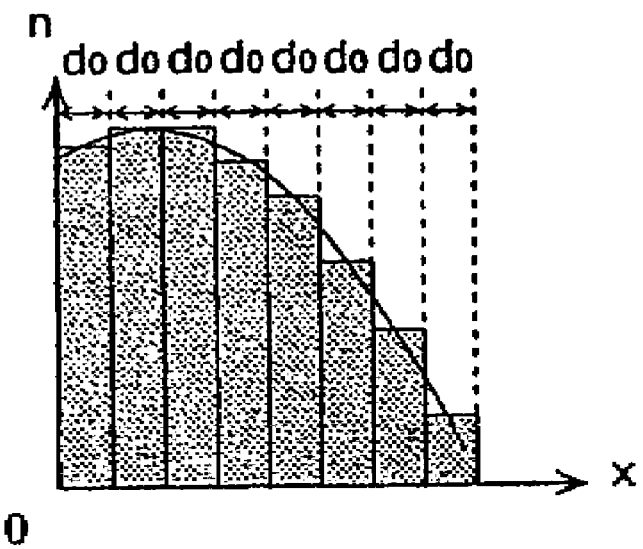
FIG. 11 is a diagram showing a refractive index distribution (equal pitch) of the lens of the first embodiment.

The most distinguished characteristic of the present invention is that the combination of the basic structures can be changed, so that the refractive index distribution can be controlled without constraints. In the present invention, the change of the refractive index of the distributed index lens 1 is represented by a solid line in FIG. 11. The refractive index of the distributed index lens 1 is the highest at the center area of the circle, and the refractive index becomes lower towards the edge. The parabolic arch indicates a refractive index distribution. The parabola indicated in FIG. 11 shows a refractive index distribution for collecting incident light with a wavelength λ (550 nm) in a focal length f (3.0 μm), and it is denoted by the following equation:

$$\Delta n(x) = \Delta n_{max}\left[\frac{(Ax^2 + BxSin\theta)}{2\pi} + C\right] \quad (A, B, C: \text{constants}) \quad (1)$$

Here, $\Delta n_{max}$ indicates a difference of refractive indexes (this case is 1.43) between an incoming side medium and a lens material. Furthermore, in the equation (1), the parameters can be set by the equations below, where the refractive index on the incoming side medium is n$_0$, and the refractive index on the outgoing side medium is n$_1$:

$$A = -(k_0 n_1)/2f \quad (2)$$

$$B = -k_0 n_o \quad (3)$$

$$k_0 = -2\pi/\lambda \quad (4)$$

Thus, a lens can be optimized according to the respective factors: a desired focal length, an incident angle of the incident light to be objected, and (or) a wavelength. It should be noted that the term defined by quadric of a distance x from the pixel center denotes a collecting-light component, and the term defined by product of x and trigonometric function denotes a deflection component respectively in the equation (1).

The parabolic defined by the equation (1) is continuous obviously, and shows an ideal refractive index distribution. However, according to the actual micro optic system (sub-micron area), forming a continuous distribution is extremely difficult, and the process loads is so heavy. According to the present invention, a discretization by the area not more than half-width of an incident light wavelength is used for the refractive index distribution of a lens. Thus, the same effect can be achieved successfully. For example, the discretization by an equal period basis (that is, line width d$_0$) is used for the refractive index distribution as shown in FIG. 11. Accordingly, the line width of the basic structure can be constant, and the process condition (lithography, etching and the like) can be equalized between pixels. As a result, the process can be performed with ease and high accuracy.

Figure 12:
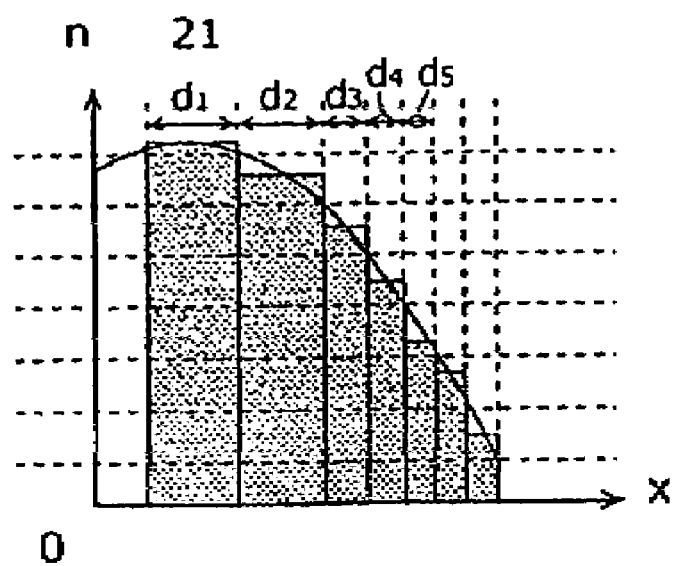
FIG. 12 is a diagram showing a refractive index distribution (unequal pitch) of the lens of the first embodiment.
Figure 13:
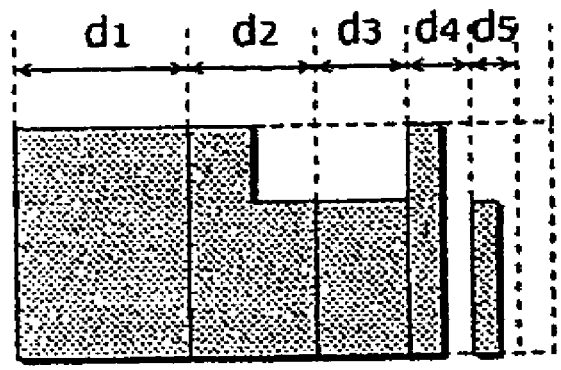
FIG. 13 is a diagram showing a basic structure forming the distributed index lens (unequal pitch) of the first embodiment.

As an alternative, the discretization by an unequal period basis (that is, d$_1$>d$_2$>d$_3$>d$_4$>d$_5$) is used for the refractive index distribution as shown in FIG. 12. It should be noted that, in this case, each line width is defined to equalize the refractive index. The structure of the distributed index lens of this case is shown in FIG. 13, and the refractive index lens is structured by combining a high refractive index material and a low refractive index material in the areas having different line widths respectively. The advantage of this structure is that the refractive index distribution can be divided so as to make the refractive index distribution equal, so that the reproducibility of the refractive index distribution is high and the light-collecting efficiency can be improved.

Note that FIG. 8 shows a lens structure using 0° of the incident light angle, and an equal pitch as the dividing method, and then the center of the optics corresponds to the center of each pixel.

Figure 14:
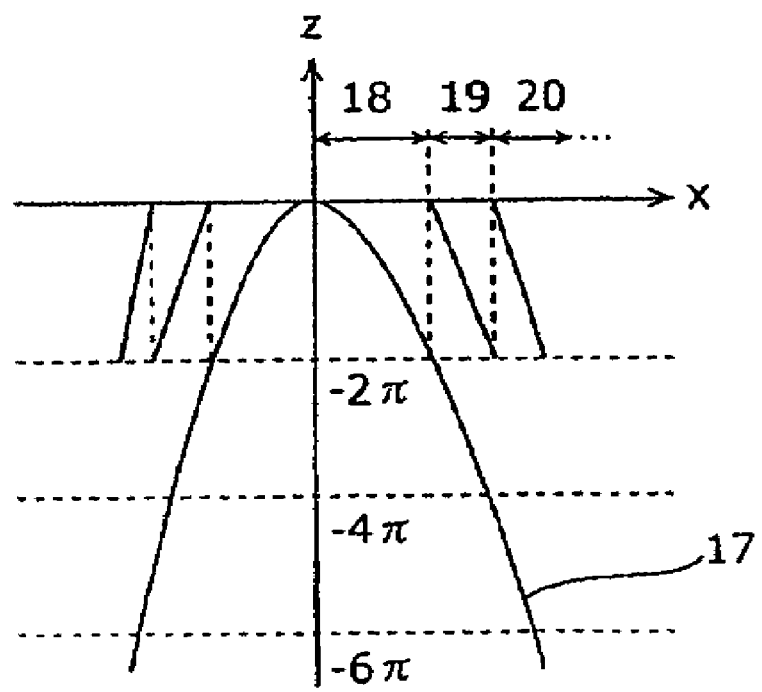
FIG. 14 is a diagram showing a phase modulation of a light of the first embodiment.
Figure 15A:
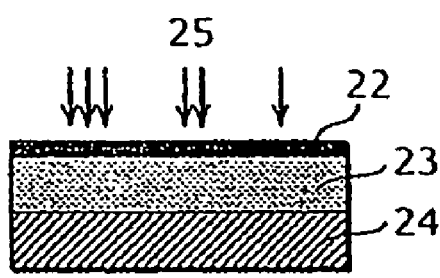
FIG. 15A to FIG. 15G are diagrams showing a manufacturing process of the distributed index lens of the first embodiment.
Figure 15E:
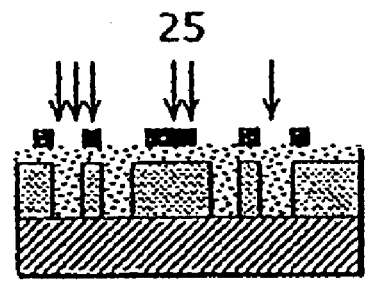
Figure 15B:
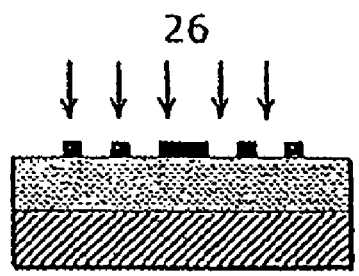
Figure 15F:
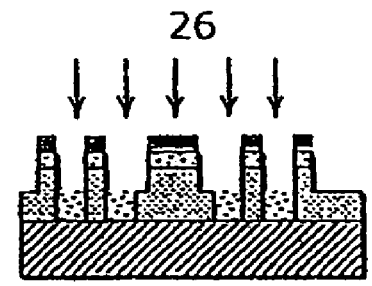
Figure 15C:
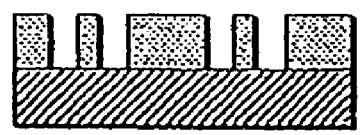
Figure 15G:
Figure 15D:
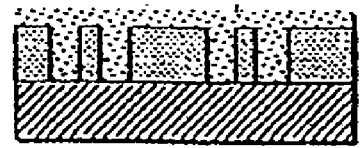

In the present embodiment, a phase modulation of the incident light is performed depending on the refractive index, so as to control a transmission direction of the light. At this time, the phase modulation obtained by the equation (1) is a discontinuous phase modulation, which are indicated by not only the first zone 18, but also the second zone 19, the third zone 20 and the like, obtained by dividing the equation (1) by 2π, as shown in FIG. 14. However, the zone is divided every one phase, and therefore an effective phase modulation equals to a continuous phase modulation 17 (denoted by a solid line curve).

The second characteristic of the present invention is that a light collecting generated by the refractive index distribution can be strengthened by a film thickness distribution. In general, in the diffraction optics, a structure greater than a wavelength is systematized by Fourier optics, and a structure smaller than a wavelength is systematized by the effective refractive index method. A light is regarded as a line in the former case, while a light is regarded as a wave in an electromagnetic field in the latter case. A resonance area is an area placed between the aforesaid two theoretical regions, and the behavior of a light is allowed in either a line or an electromagnetic wave.

Here, in the lens structure of the present invention, the width of the divided each zone area is set as around $\lambda/2n$, which is on the boundary between the resonance area and the effective refractive index method. In this state, the incident light senses both a refractive index of the material itself, and a refractive index (effective refractive index) which is equalized according to the structure. As a result, the lens has the light-collecting characteristics of both the distributed index lens and the film thickness distribution lens, so that the light-collecting effectiveness becomes higher than a conventional distributed index lens.

FIG. 15 A to FIG. 15 G are diagrams showing a manufacturing process of the distributed index lens of the present invention. The distributed index lens has a two-stage concentric circle structure, and photo-lithography and etching are performed two times respectively in the process. Firstly, a light-receiving device, an inter-connection, a light-shielding layer, a signal transmitting unit and a color filter are placed on an Si substrate so as to form a semiconductor circuit 8 (not indicated in FIG. 15) using a general semiconductor manufacturing process. One pixel is 2.25 μm square in size, and the light-receiving device is 1.5 μm square in size. After that, an $SiO_2$ film 23 is formed, and a resist 22 is coated thereon using a CVD (Chemical Vapor Deposition) device. Then, a patterning is performed by a light exposure 25 (refer to FIG. 15 A). The thickness of the $SiO_2$ film is 1.2 μm and the resist is 0.5 μm respectively.

After developing, a fine structure is formed on the pixel surface by etching 26 (FIG. 15 B and FIG. 15 C). After removing the resist, BARK (Bottom Anti-reflection Coating) is embedded so as to planarize the surface (FIG. 15 D). After applying the resist, a patterning is performed by the light exposure 25 again (FIG. 15 E). After the etching (FIG. 15 F), the resist and the BARK are removed so as to form the lens of the present invention (FIG. 15 G).

In the present embodiment, forming a lens having two-stage concentric circle structure is shown. In addition, a lens having plural stages (more than three stages) can be formed by a process combining photo-lithography and etching. The more the number of stages is increased, the more the limit of the resolution is increased, so that the light-collecting efficiency is improved.

Hereafter, the aforesaid process is used in forming of the distributed index lens.

Second Embodiment

Figure 16:
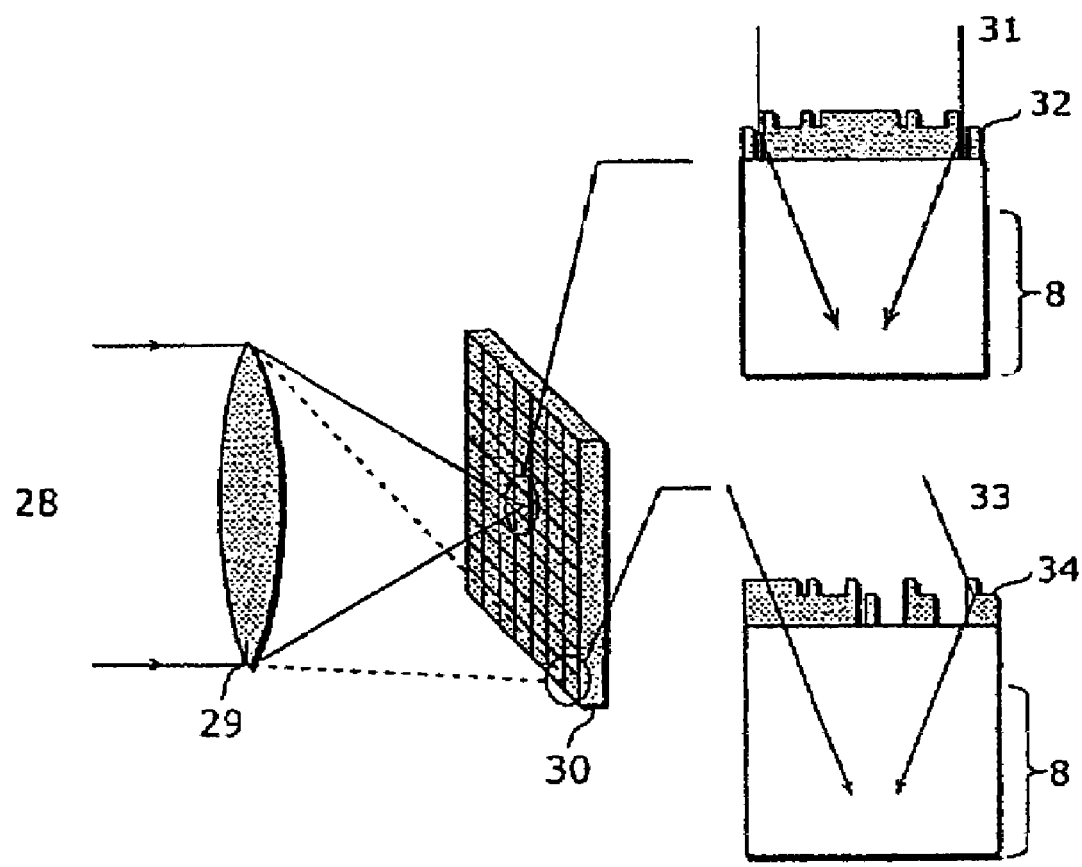
FIG. 16 is a diagram showing a pixel array in a solid-state imaging device of a second embodiment.

FIG. 16 is a diagram showing a pixel array in a solid-state imaging device using a video graphics array (VGA) (310,000 pixels) of the second embodiment. A signal light 28 is collected into an optical lens 29, and irradiated on the solid-state imaging device 30 having a lens. In the solid-state imaging device in which a semiconductor integrated circuit including a light-receiving device, interconnections and the like and distributed index lens 32 (or 34) are arranged in a two-dimensional array, the incident angle of light is different for pixels in a center part and for pixels near the edge. While the incident light 31 enters at approximately 0° into the pixels in the center part, the incident light 33 enters at the incident angle of approximately 30° into the pixels near the edge. Accordingly, in the present embodiment, the distributed index lenses corresponding to the incident light component with the strongest light intensity that is incident into each pixel are formed from the center part towards the edge of the solid-state imaging device. Each distributed index lens optimizes the lens structure depending on the position of the pixel on the solid-state imaging device so that the light-collecting efficiency becomes the highest.

FIG. 17 A to FIG. 17 C are diagrams showing a basic structure of pixels which is dependent on an incident angle (pixel position). The distributed index lenses 38, 29 and 40 have refractive index distribution denoted by the equation (1) relative to the incident light. A light 35 incoming to an incident window at incident angle of 0° is collected into a distributed index lens 38 for an incident light 0°, a light 36 incoming to an incident window at incident angle of α/2° is collected into a distributed index lens 39 for an incident light a/2°, a light 37 incoming to an incident window at incident angle of α° is collected into a distributed index lens 40 for an incident light a α°. Then, the light passes a color filter 2, and then converted into an electric signal.

According to the distributed index lenses 38, 39 and 49 of the present embodiment, the structure of the lens in each pixel can be optimized depending on a wavelength of the incident light, so that there is no difference of the light-collecting efficiency depending on incident angle, and the light-collecting efficiency can be high. In the distributed index lens 38 for an incident light 0°, the center of the concentric circle is located at a pixel center. When the incident angle is increased, the center of the concentric circle is shifted to the incident side of the light.

Figure 18C:
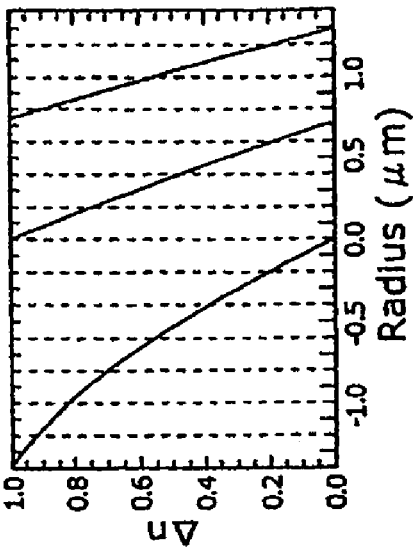
FIG. 18 A to FIG. 18 C are diagram a showing refractive index distributions of three kinds of lenses of the second embodiment.
Figure 18B:
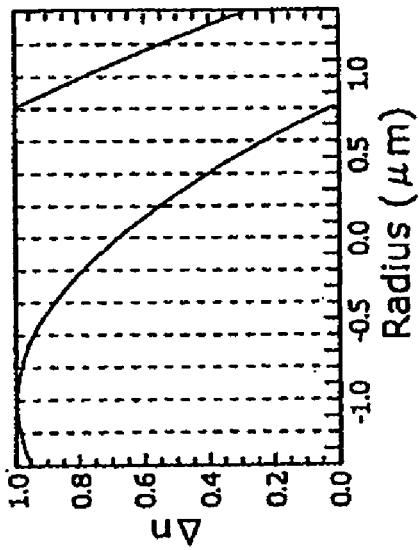
Figure 18A:
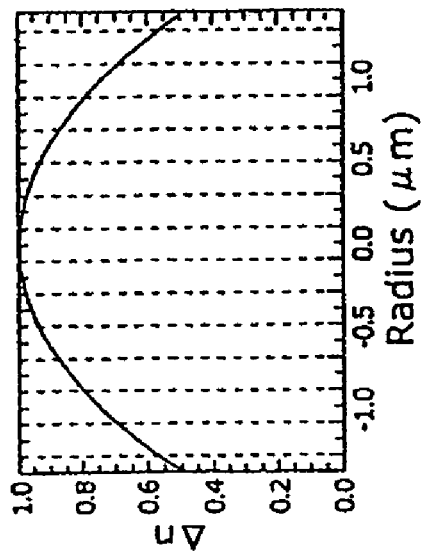

This is because that, as shown in the equation (1), the maximum value of a quadratic curve for the refractive index distribution shifts to incident light side with the increase of incident angle θ (refer to FIG. 18 A to FIG. 18 C). At this time, the concentric circle structure of the lens is asymmetrical to the pixel area (refer to FIG. 17 B and FIG. 17 C).

In addition, it is obvious from the relation of the parameters A, B, and $K_0$, the phase modulation is different depending on the wavelength of the light to be incident. This indicates that the lens has an optimum lens structure depending on the light color incoming into each pixel. In the present embodiment, in the case where light of respective wavelengths of 0.45 μm, 0.55 μm and 0.65 μm are incident on each pixel having a lens structure of each color, it is known that each pixel has a high light-collecting efficiency of around 80 percent.

Figure 19:
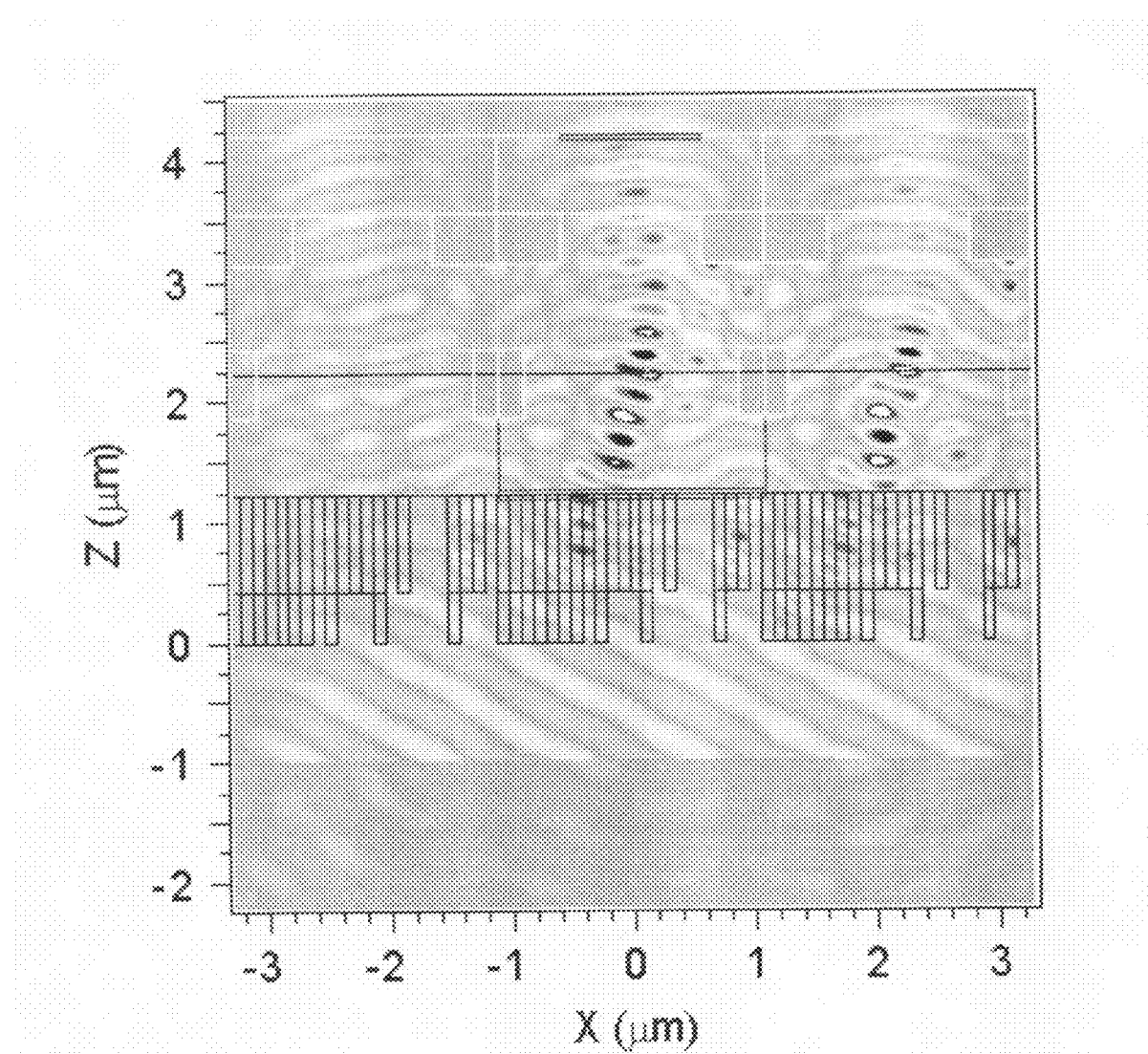
FIG. 19 is a diagram showing a light transmission profile in a pixel of the second embodiment.

FIG. 19 is a diagram showing a simulation result of a light transmission profile in a pixel for the incident light with the incident angle of 45°. It can be seen in the diagram that the transmission direction of the incident light is refracted at the time of passing the lens, and the incident light focuses at the first interconnection (light-shielding layer), and then the light is transmitted to the light-receiving device. This indicates that the distributed index lens which is made in accordance with the equation (1) enables to transmit the light efficiently to the light-receiving device.

Figure 20:
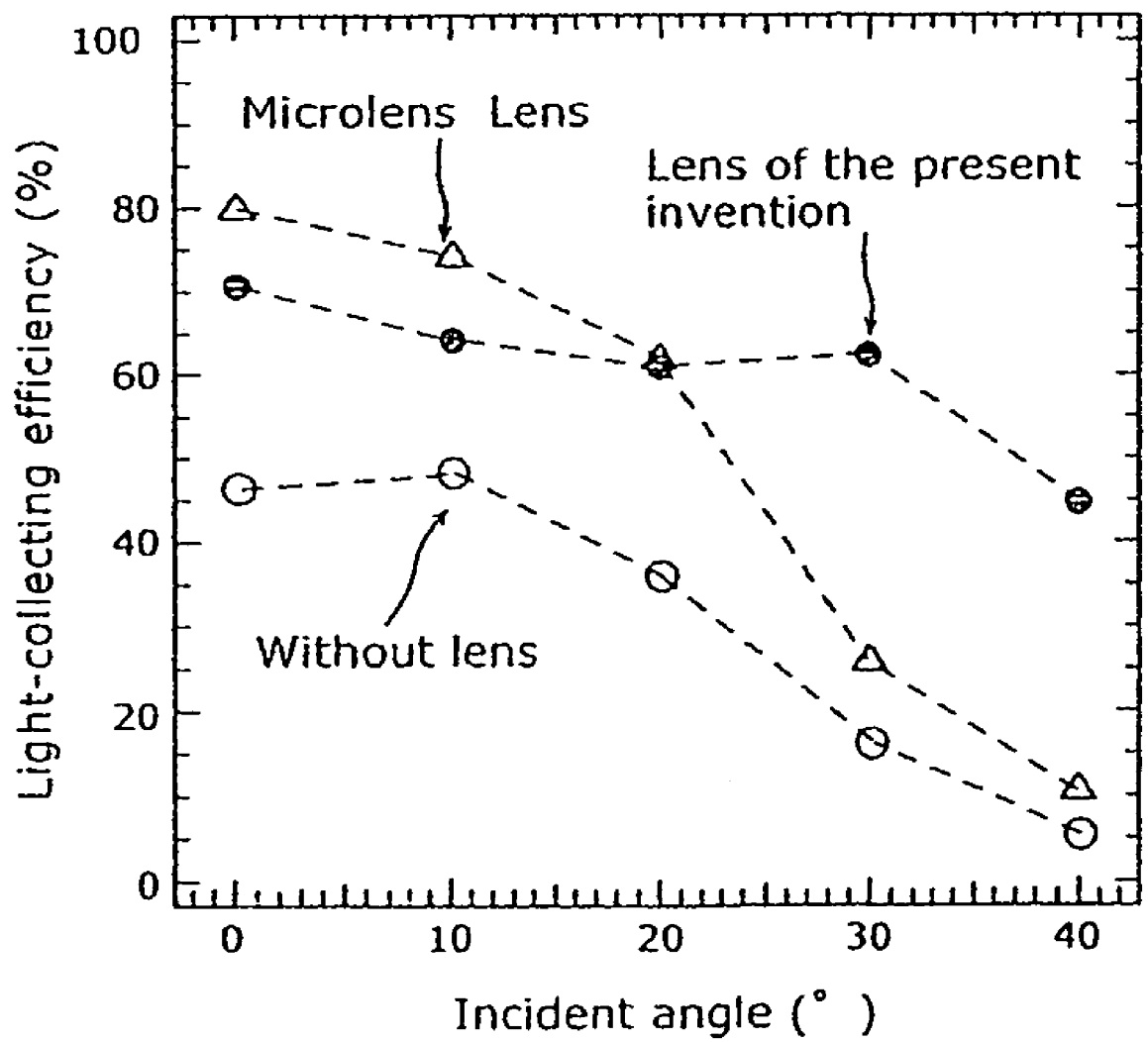
FIG. 20 is a diagram showing a light-collecting efficiency of the solid-state imaging device of the second embodiment.

FIG. 20 is a diagram showing a dependency on an incident angle of the light-collecting efficiency. The angle on the x-axis indicates an angle of the light incident to the solid-state imaging device, and 0° is the incident light to the pixels at the center part, while 300 or higher indicate the light incident to the pixels at the edge. The light-collecting efficiency of the solid-state imaging device using a conventional microlens declines sharply at around the pixels of the incident angle 20°, while the light-collecting efficiency of the distributed index lens of the present invention maintains 60% even the pixels at the edge. Furthermore, in the area around the incident angle 40°, the light-collecting efficiency is four times of that of the microlens.

It is obvious from FIG. 20 that the distributed index lens of the present invention is superior in the angle dependency of the incident light comparing with the microlens. According to this, the decline of the light-collecting efficiency along with the increase of the incident angle can be moderated. Therefore, it can be expected that the distributed index lens of the present invention is applicable to a short focal length optic system such as a camera equipped in a mobile phone.

Third Embodiment

Figure 21:
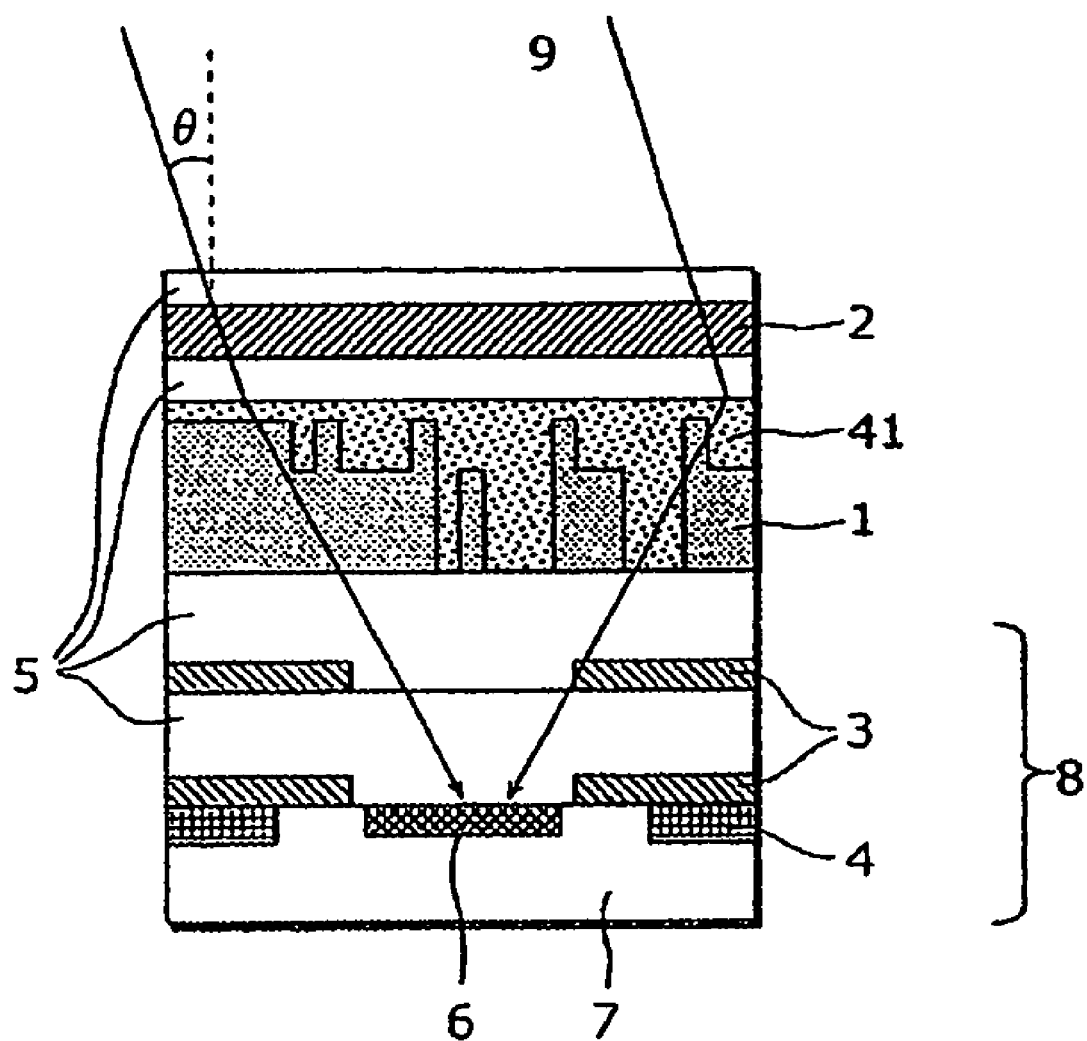
FIG. 21 is a diagram showing a basic structure of one pixel of a third embodiment.

FIG. 21 is a diagram showing the distributed index lens of the present embodiment composed of two kinds of the light-transmitting materials other than air. The distributed index lens does not include an air area, so that the dynamic range of the refractive index variation is decreased. However, the surface of the lens can be planarized, so that the scattering loss can be decreased. In addition, it is possible to deposit other light-transmitting materials on the lens, so that the distributed index lens of the present invention is applicable for multilayer film. Furthermore, the strength of the lens is reinforced, so that higher durability of the distributed index lens can be implemented. In the present invention, the distributed index lens is used as one of an in-layer lens, and it is obvious that the distributed index lens can be used as a lens placed on the top. At this time, the distributed index lens performs as a film to protect the lens from contaminations.

Fourth Embodiment

Figure 22:
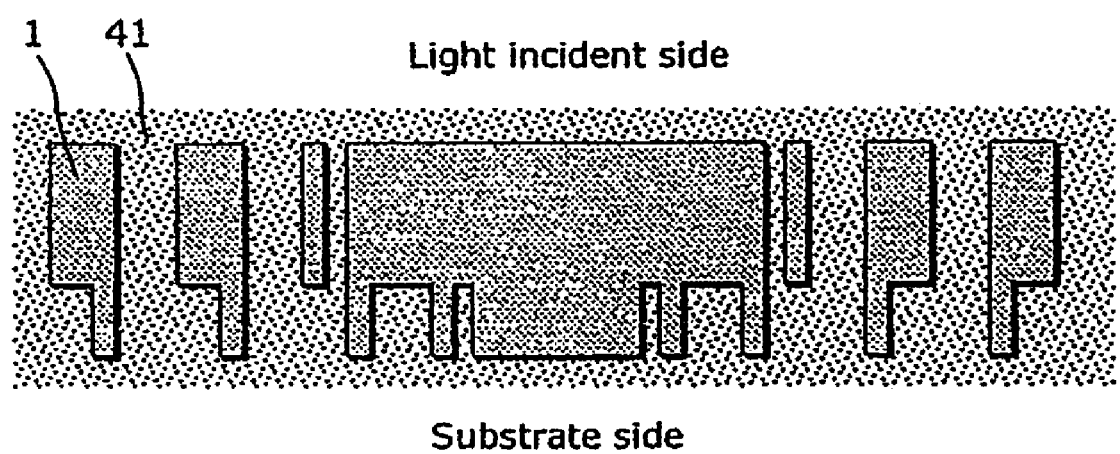
FIG. 22 is a diagram showing a cross-sectional diagram of the distributed index lens of a fourth embodiment.
Figure 23A:
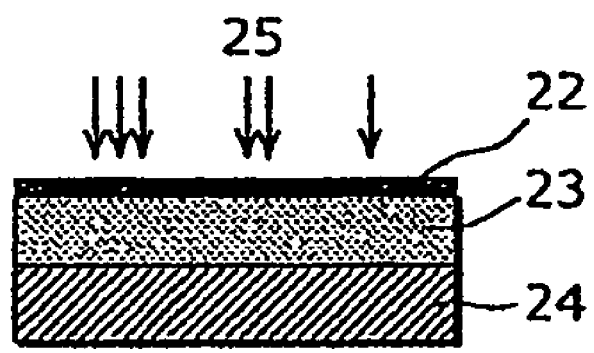
FIG. 23 A to FIG. 23 D are diagrams showing a manufacturing process of the distributed index lens of the fourth embodiment.
Figure 23B:
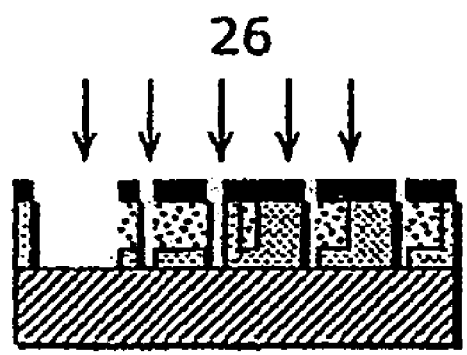
Figure 23C:
Figure 23D:
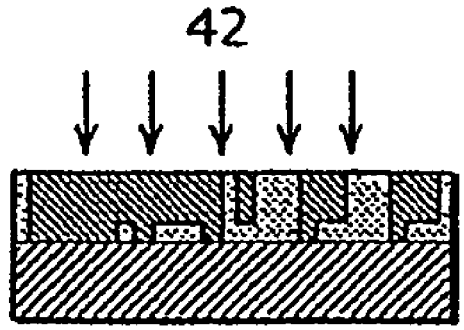

FIG. 22 is a diagram showing the distributed index lens with concave structure of the forth embodiment. The first characteristic of the distributed index lens of the fourth embodiment is that the structure of the light incident side is relatively wider, and the structure of the substrate side is relatively narrower. Such distributed index lens with concave structure has more planarity on the lens surface, so that the scattering loss of the incident light on the surface is lowered, and the light-collecting efficiency can be improved. The second characteristic of the distributed index lens of the fourth embodiment is that the manufacturing process can be simplified and an easier fine processing can be implemented.

FIG. 23 A to FIG. 23 D are diagrams showing a manufacturing process of the distributed index lens of the present embodiment. The lens is formed by optical lithography and etching. Firstly, a light-receiving device, an interconnection, a light-shielding layer, a signal transmitting unit, a color filter and the like are placed on the Si substrate using an ordinary semiconductor manufacturing process so as to form a semiconductor integrated circuit (not indicated in FIG. 23 A to FIG. 23 D). One pixel is 2.25 µm square in size, and the light-receiving device is 1.5 µm square in size. After that, an $SiO_2$ film 23 as a low refractive material is formed, and a resist 22 is coated thereon using a CVD device. Then, a pattering is performed by an optical lithography (refer to FIG. 23 A). The thickness of the $SiO_2$ is 1.2 µm and the resist is 0.5 µm respectively. As described in the first embodiment using FIG. 15, the patterning, the embedding of BARK, and the etching 26 are iterated in the manufacturing process of the semiconductor integrated circuit, so as to form a two-stage concentric circle structure (FIG. 23 B). After the resist and the BARK are removed (FIG. 23 C), an SiN42 is embedded thereon using the CVD (FIG. 23D). Lastly, the surface of the lens is planarized, so as to form the distributed index lens of $SiO_2$ on which SiN is embedded.

The manufacturing process shown in FIG. 23 enables to form a lens of a high refractive material such as SiN, $TiO_2$ and the like, on which a fine processing being difficult to be conducted generally, composed of the high refractive material with a silica system material and a resin material as a basic component. In addition, the light-transmitting materials can be embedded on the upper part and the lower part of the lens at the same time, so that the number of manufacturing processes can be decreased, and the cost required for the manufacture can be reduced.

Figure 24:
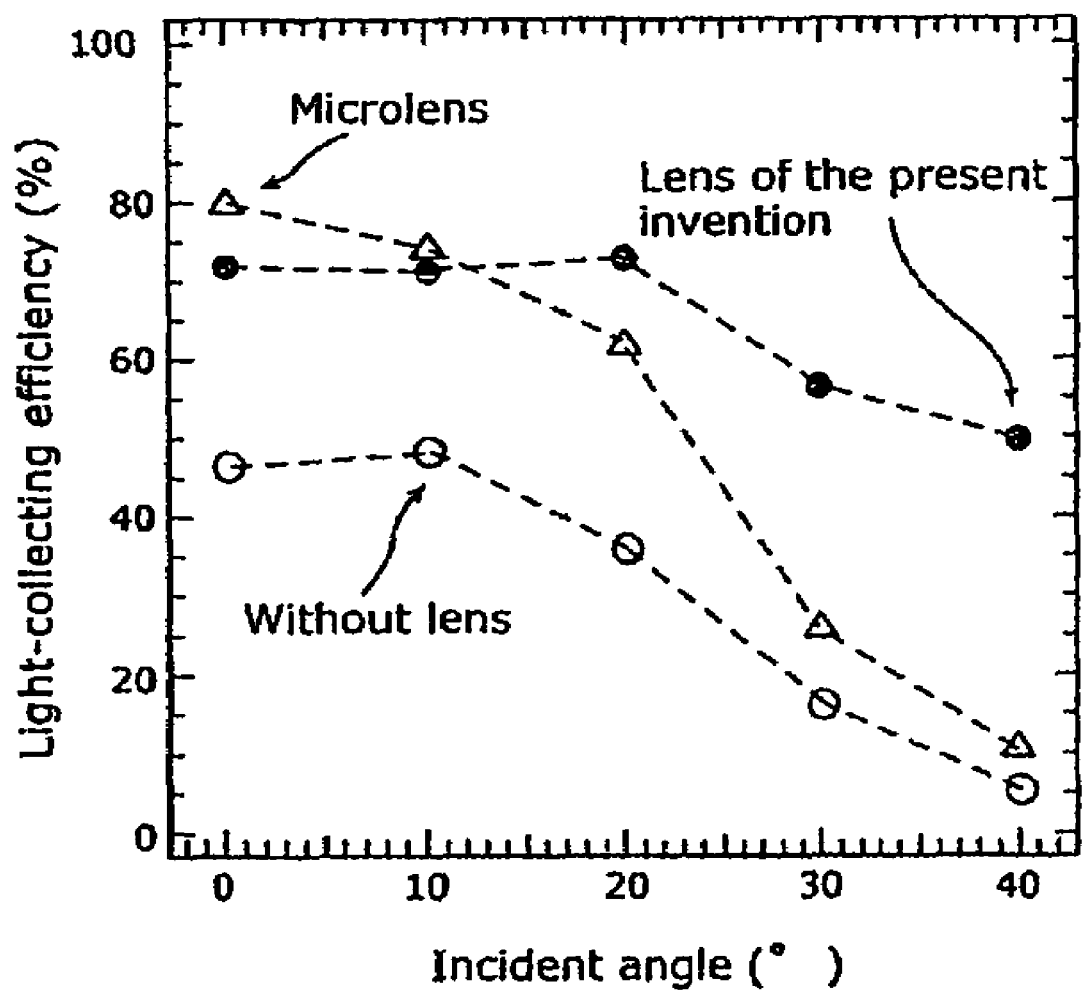
FIG. 24 is a diagram showing a light-collecting efficiency of the solid-state imaging device of the fourth embodiment.

FIG. 24 is a diagram showing a dependency on an incident angle of the light-collecting efficiency. The light-collecting efficiency of the solid-state imaging device using a conventional microlens declines sharply at around the incident angle 200 of pixel, while the light-collecting efficiency of the distributed index lens of the present invention maintains 50% in the nearby pixels (in the area of the incident angle 40°).

Fifth Embodiment

Figure 25A:
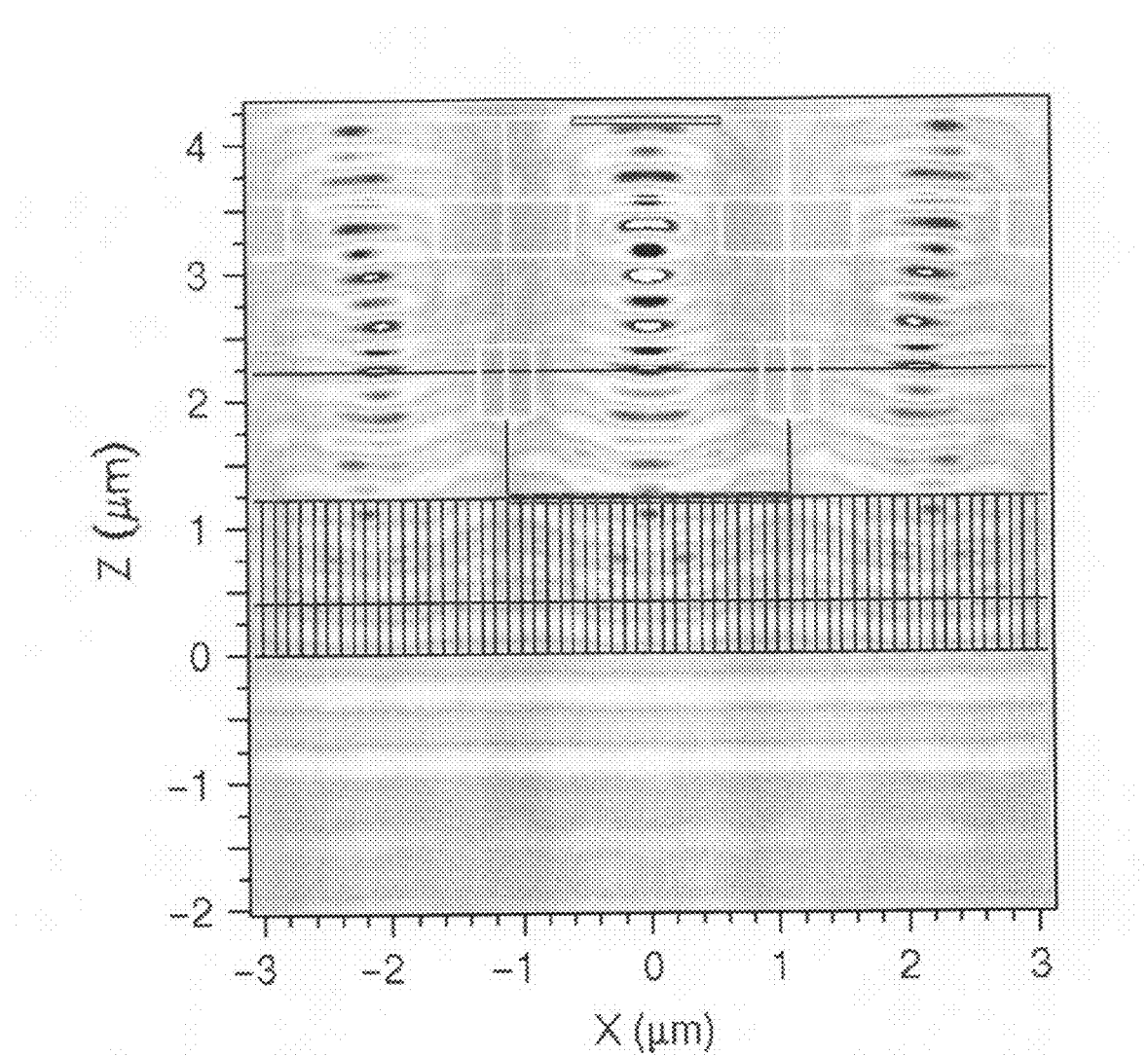
FIG. 25 A and FIG. 25 B are diagrams showing a light transmission profile in a pixel of a fifth embodiment.
Figure 25B:
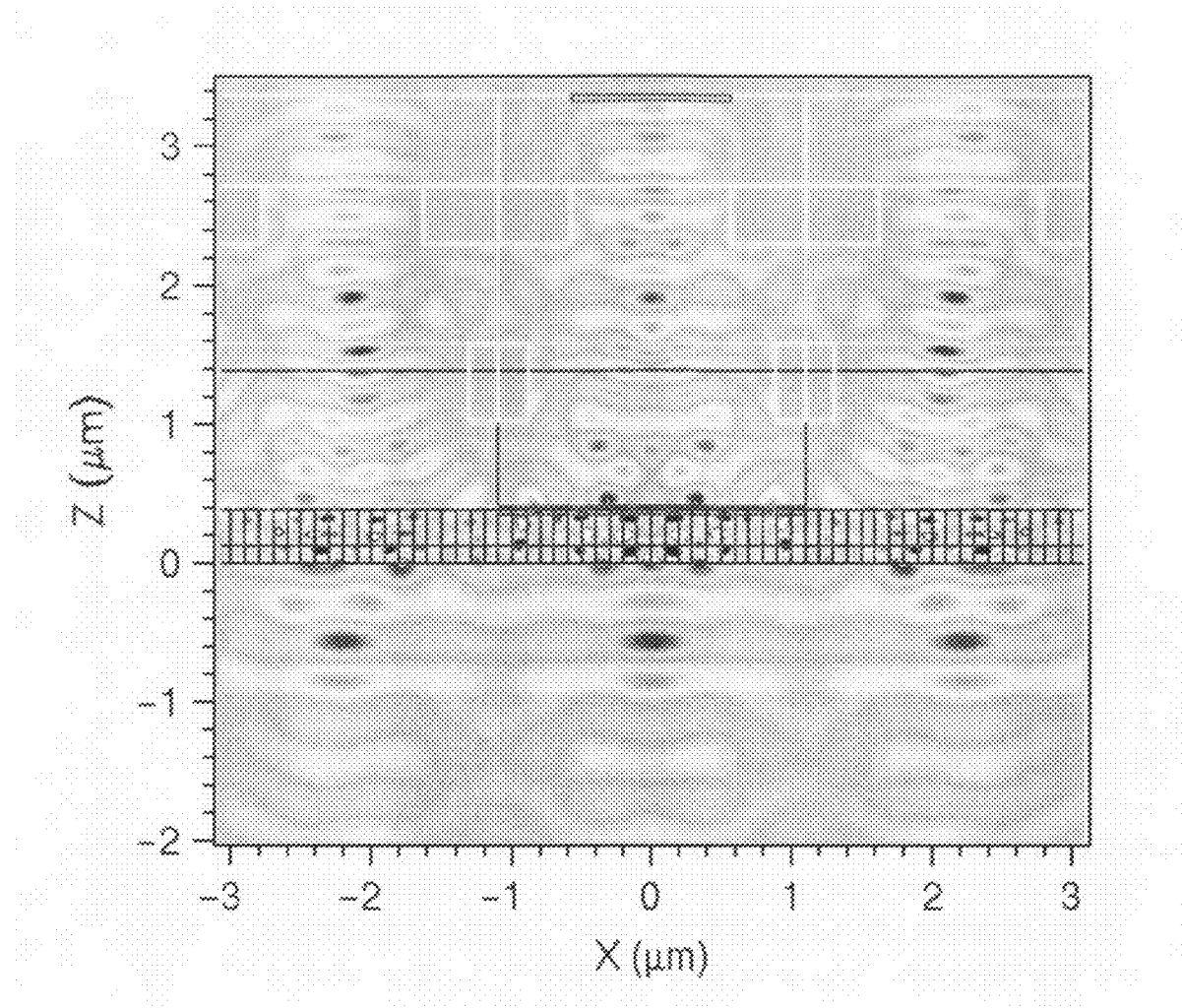

FIG. 25 A and FIG. 25 B are diagrams showing a simulation result of a light transmission profile in a pixels of the distributed index lens composed of two kinds of materials (incident 0°). FIG. 25 A shows a case of a lens with a small difference of the refractive index, and it can be seen in the diagram that the incident light focuses at the first interconnection (light-shielding layer), and then the light is transmitted to the light-receiving device. This indicates that the distributed index lens enables to transmit the light efficiently to the light-receiving device. FIG. 25 B shows a case of a lens with a high difference of the refractive index, and it can be seen in the diagram that the reflection light and the scattering light component becomes bigger, so that the amount of the light which reaches the light-receiving device is decreased.

Figure 26:
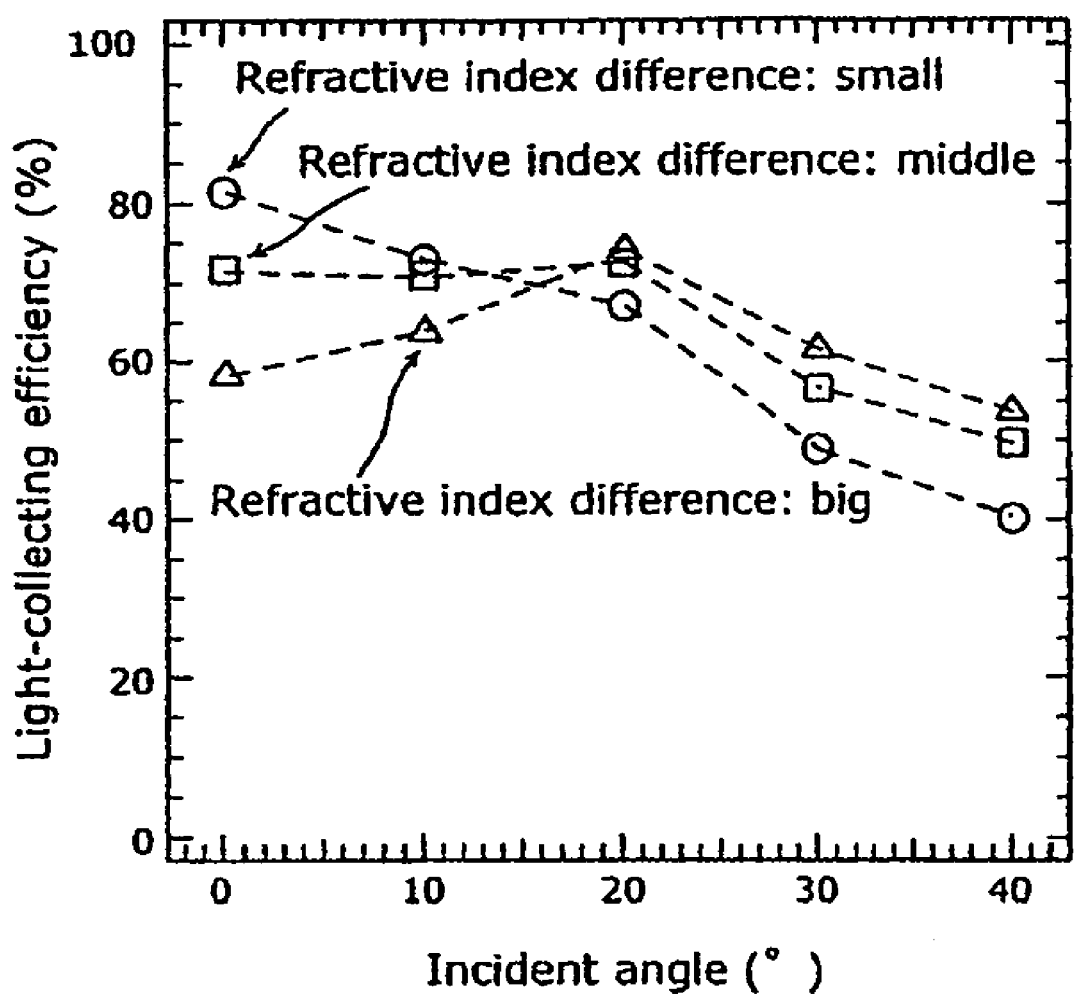
FIG. 26 is a diagram showing a light-collecting efficiency of the solid-state imaging device of the fifth embodiment.

FIG. 26 is a diagram showing a dependency on an incident angle of the light-collecting efficiency. As described above, a lens with a small difference of the refractive index has a higher light-collecting efficiency in the low angle incident area. However, the light-collecting efficiency of the lens with a bigger difference of the refractive index can be raised along with the increase of the incident angle. This is because that when the difference of the refractive index is bigger, an optical path length (=refractive index of lens: n*lens film thickness: to) becomes longer, so that the deflection is improved. The same effect can be obtained by changing the lens film thickness.

Sixth Embodiment

Figure 27:
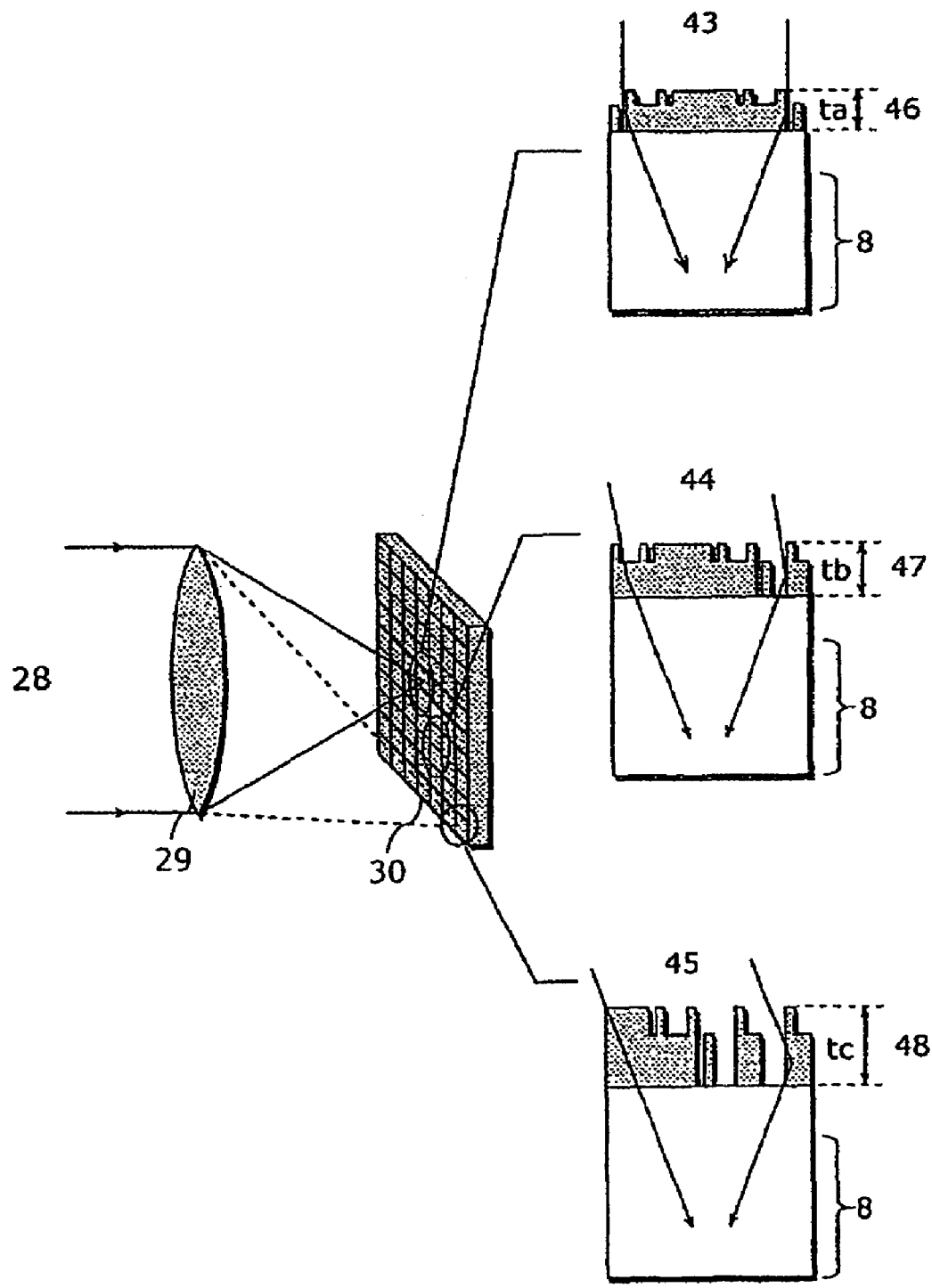
FIG. 27 is a diagram showing a pixel array in a solid-state imaging device of a sixth embodiment.

FIG. 27 is a diagram showing a pixel array in a solid-state imaging device using a video graphics array (VGA) (310,000 pixels) of the sixth embodiment. The signal light 28 is collected into the optical lens 29, and irradiated on the solid-state imaging device 30 having the distributed index lenses (composed of BCB (Benzocyclobutene)/SiN) 46, 47 and 48. The resin materials such as BCB enable to form a thick film and enable to provide an easier post process, so that the distributed index lens with high light-collecting efficiency can be formed. In the pixels at the center part with lower incident angle, the lens film thickness $t_a$ is thinner (0.6 μm). The lens film thickness is increased towards the edge along with the increase of the incident angle. In the pixel for an incident 40°, the film thickness $t_c$ is 1.0 μm. The distributed index lens is optimized according to the incident angle, so that the sensitivity of the whole pixels is improved, while the signal strength of the pixels near the edge is decreased by about 20%.

Seventh Embodiment

Figure 28:
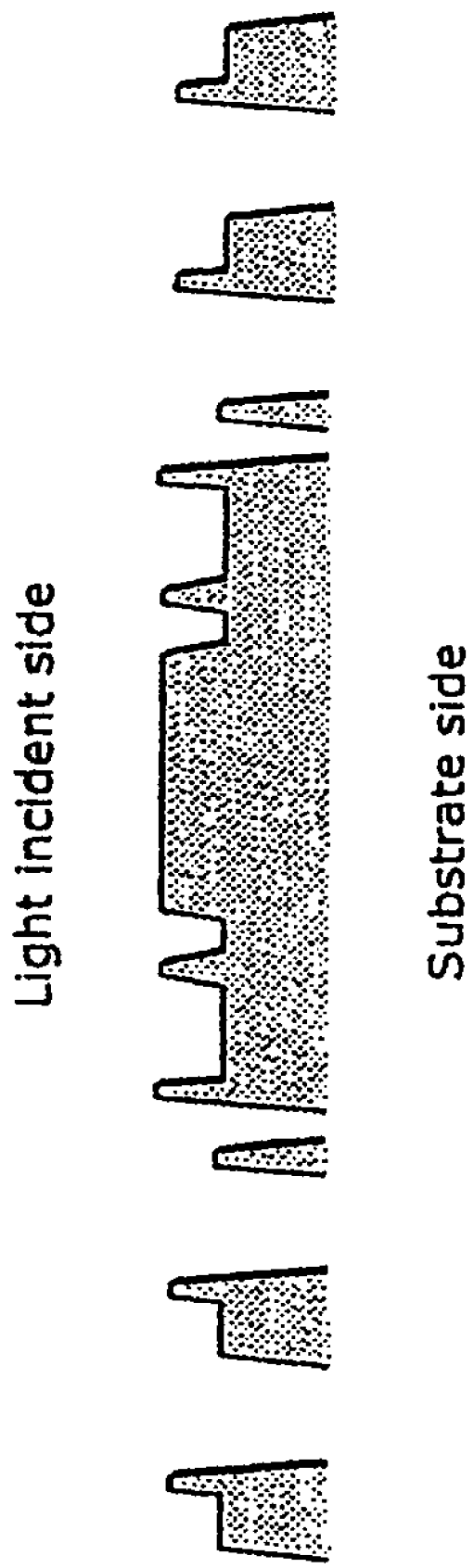
FIG. 28 is a diagram showing a cross-sectional diagram of the distributed index lens of a seventh embodiment.

FIG. 28 is a diagram showing the distributed index lens whose cross section is a taper structure of the seventh embodiment. The cross section of the light-transmitting film in each zone is a taper structure whose line width is getting thicker towards the incident light direction. There is no sudden reflection change with this structure, so that the scattering and reflection of the light on the surface of the lens can be reduced, and the incident light can be collected into the pixel efficiently. As a result, the light-collecting efficiency can be improved. On the other hand, the cross section of the light transmitting film in each zone is a rectangular structure (refer to FIG. 9), the refractive index change sensed by the incident light is increased, so that the light collecting and the deflection of the lens are improved. The determination on which structure is used depends on the purpose of the solid-state imaging device. It is preferable that in the case of the device for low angle incident light, the taper-lens with high efficiency of light collecting is used, while in the case of the device for high angle incident light, the rectangular-lens with higher deflection is used respectively.

Eighth Embodiment

Figure 29:
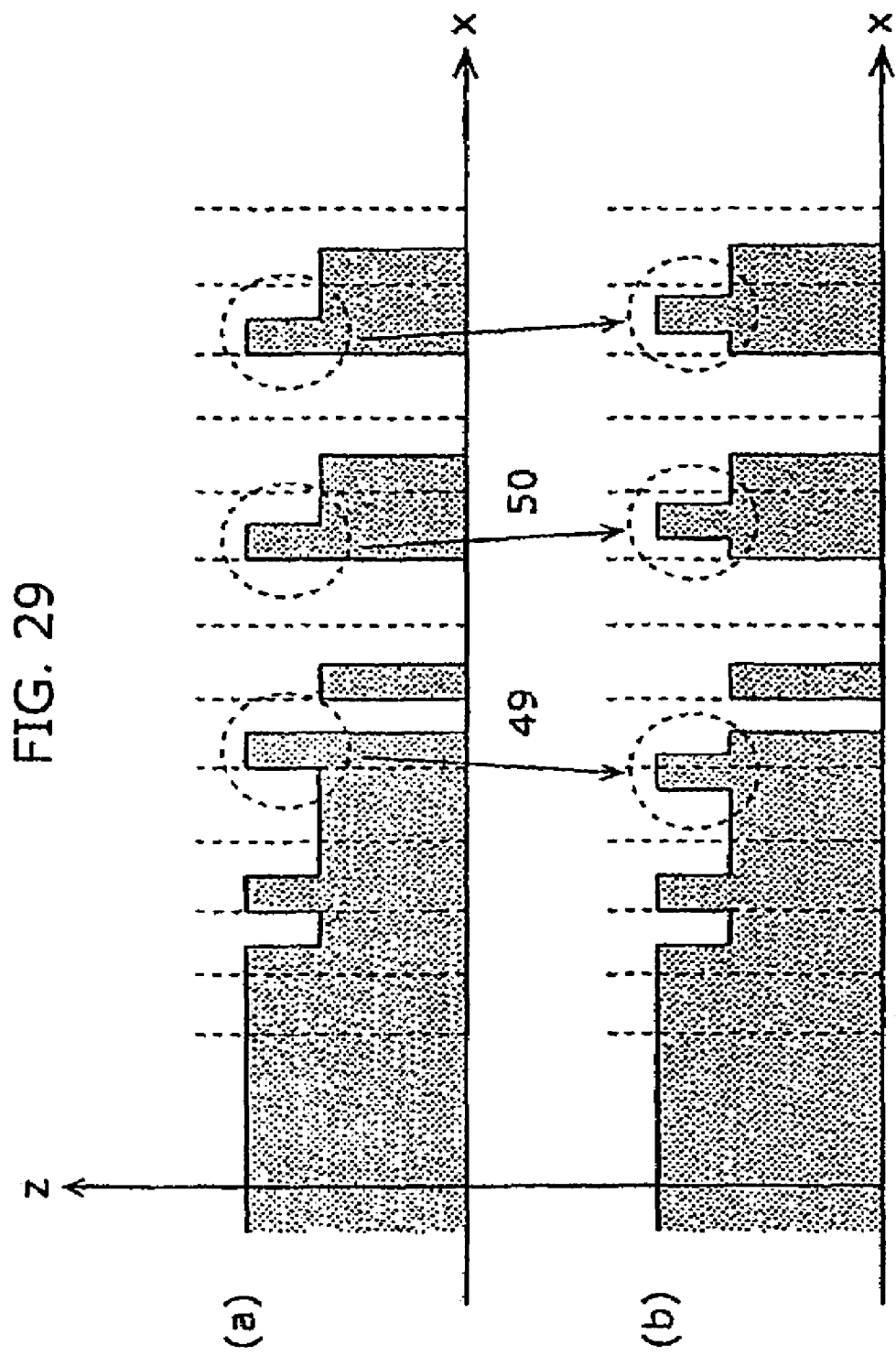
FIG. 29 is a diagram showing a countermeasure for a misalignment of a position occurred during lithography of an eighth embodiment.

FIG. 29 is a diagram showing a countermeasure for a misalignment of a position occurred during lithography.

In the distributed index lens of the present embodiment, the positioning of an upper film and a lower film at the time of the process is necessary as many times as the number of the stages. Thus, as shown in FIG. 29 (a), in the case where the upper film is flush with the lower film in the designing (surrounded by dotted circles), the pattern tapers off or disappears by even a small amount of positioning misalignment. On the other hand, as shown in FIG. 29 (b), in the case where the upper film and the lower film, which patterns having a relatively higher aspect ratio, have already been misaligned in the designing, the pattern deviation can be prevented to the minimum level. A wider positioning margin can be set in proportion to the width of the wavelength of the incident light, and in the case where the margin is not more than $\lambda/4n$, a sharp decrease of the light-collecting efficiency is not observed.

Ninth Embodiment

Figure 30:
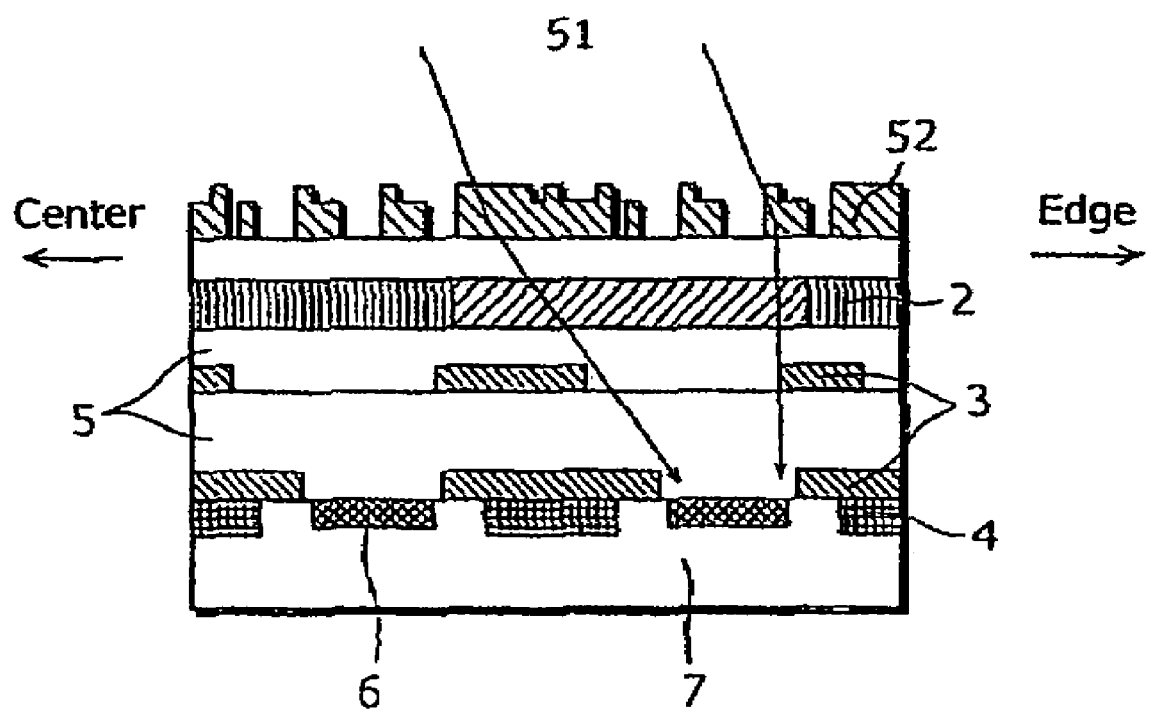
FIG. 30 is a cross sectional diagram showing a solid-state imaging device of a ninth embodiment.

FIG. 30 is a cross-sectional diagram showing a lens placed on the solid-state imaging device having a shrinking structure. The solid-state imaging device is shrunk, so that the deflection component of the lens can be smaller, and the amount of phase modulation can be reduced. As a result, the designing of the lens can be simplified and the light collecting efficiency can be improved.

The distributed index lens with concentric circle structure is exemplified in the aforesaid embodiments 1 to 9. However, it should be noted that the shape of the distributed index lens can be polygon such as rectangular, hexagon and the like, as long as the lens has the concentric structure. Furthermore, the distributed index lens with the two-stage concentric structure is exemplified in the aforesaid embodiments 1 to 9. However, the present invention is applicable to the distributed index lens with multiple-stage concentric structure such as a three-stage concentric structure.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The solid-state imaging device of the present invention enables to improve performances and implement price reductions for imaging sensor related products such as digital video camera, digital still camera, and a camera-equipped mobile phone, and is useful for the related industries.

What is claimed is:

1. A solid-state imaging device, comprising:
  a lens having a modulated effective refractive index distribution by including a combination of a plurality of zone areas with a plural-stage concentric structure, the plurality of zone areas being divided, in a whole area of said lens, into line widths which are equal to or shorter than a wavelength of an incident light, and
  wherein at least one of the plurality of zone areas includes a lower light-transmitting film with a first plural-stage concentric structure and having a first line width and a first film thickness, and an upper light-transmitting film with a second plural-stage concentric structure, configured on said lower light-transmitting film, and having a second line width and a second film thickness,
  wherein the plural-stage concentric structure includes a plurality of basic patterns each having a different combination of the upper light-transmitting film and the lower light-transmitting film, and
  wherein a width of one of the plurality of basic patterns located at an outer side of the plural-stage concentric structure is smaller than the wavelength of the incident light.

2. The solid-state imaging device of claim 1, wherein a volume ratio between said lower light-transmitting film and said upper light-transmitting film in a zone area and a volume ratio between said lower light-transmitting film and said upper light-transmitting film in another zone area adjacent to the zone area are different.

3. The solid-state imaging device of claim 1, wherein respective line widths in said lens are defined as approximately $\lambda/2n$, where $\lambda$ denotes the wavelength of the incident light and n denotes a refractive index.

4. The solid-state imaging device of claim 1, wherein every line width of the plurality of zone areas in said lens is an equal line width.

5. The solid-state imaging device of claim 1, wherein said lens comprises at least two kinds of light-transmitting materials having different refractive indexes.

6. The solid-state imaging device of claim 1, wherein said lens includes one of $SiO_2$, Teraethoxy Silane, $TiO_2$, $ZrO_2$, $Nb_2O_5$, $Ta_2O_5$, $Si_3N_4$ and $Si_2N_3$.

7. The solid-state imaging device of claim 1, wherein said lens includes one of benzocyclobutene, polymethymethacrylate, polyamide and polyimide.

8. The solid-state imaging device of claim 1, wherein a structure of a light-transmitting film in a vertical cross-section including a center of said lens, which comprises a combination of said upper light-transmitting film and said lower light-transmitting film, is different depending on the wavelength of the incident light.

9. The solid-state imaging device of claim 1, wherein said lens includes a light-transmitting film, which comprises a combination of said upper light-transmitting film and said lower light-transmitting film, as an in-layer lens.

10. The solid-state imaging device of claim 1, wherein a light-transmitting film, comprising a combination of said upper light-transmitting film and said lower light-transmitting film, includes a taper structure in a cross-sectional view.

11. The solid-state imaging device of claim 8, wherein the structure of the light-transmitting film further differs depending on a focal length setting for a collected light.

12. The solid-state imaging device of claim 8, wherein the structure of the light-transmitting film further differs depending on an incident angle of the incident light.

13. A solid-state imager, comprising:
   unit pixels that are arranged in a two-dimensional array, each unit pixel including a lens, wherein said lens has a modulated effective refractive index distribution by including a combination of a plurality of zone areas with a plural-stage concentric structure, the plurality of zone areas being divided, in a whole area of said lens, into line widths which are equal to or shorter than a wavelength of an incident light, at least one of the plurality of zone areas including:
      a lower light-transmitting film with a first plural-stage concentric structure and having a first line width and a first film thickness, and
      an upper light-transmitting film with a second plural-stage concentric structure, configured on said lower light-transmitting film, and having a second line width and a second film thickness,
   wherein the plural-stage concentric structure includes a plurality of basic patterns each having a different combination of the upper light-transmitting film and the lower light-transmitting film, and
   wherein a width of one of the plurality of basic patterns located at an outer side of the plural-stage concentric structure is smaller than the wavelength of the incident light.

14. The solid-state imager of claim 13, wherein a center of the plural-stage concentric structure of said lens is offset from a center of the unit pixel.

15. The solid-state imager of claim 13, further comprising:
   a plurality of light-receivers, wherein a central axis of each of said light-receivers matches a central axis of each lens included in each unit pixel located in a center of said solid-state imager, and wherein the central axis of each of said plurality of light-receivers and a central axis of each lens included in each unit pixel located near an edge of said solid-state imager are placed toward the center of said solid-state imager.

* * * * *